(12) United States Patent
Kim et al.

(10) Patent No.: US 11,837,533 B2
(45) Date of Patent: Dec. 5, 2023

(54) SEMICONDUCTOR PACKAGE

(71) Applicant: SAMSUNG ELECTRONICS CO., LTD., Suwon-si (KR)

(72) Inventors: Dong Ho Kim, Hwaseong-si (KR); Jang Woo Lee, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 43 days.

(21) Appl. No.: 17/402,894

(22) Filed: Aug. 16, 2021

(65) Prior Publication Data

US 2022/0102257 A1    Mar. 31, 2022

(30) Foreign Application Priority Data

Sep. 28, 2020  (KR) .................. 10-2020-0125460

(51) Int. Cl.
*H01L 23/498* (2006.01)
*H01L 23/538* (2006.01)
*H01L 25/18* (2023.01)
*H01L 23/31* (2006.01)

(52) U.S. Cl.
CPC .... *H01L 23/49816* (2013.01); *H01L 23/3185* (2013.01); *H01L 23/5383* (2013.01); *H01L 23/5385* (2013.01); *H01L 23/5389* (2013.01); *H01L 25/18* (2013.01)

(58) Field of Classification Search
CPC .......... H01L 23/49816; H01L 23/3185; H01L 23/5383; H01L 23/5385; H01L 23/5389; H01L 25/18
See application file for complete search history.

(56) References Cited

U.S. PATENT DOCUMENTS

| | | |
|---|---|---|
| 7,960,822 B2 | 6/2011 | Kim et al. |
| 8,158,888 B2 | 4/2012 | Shen et al. |
| 8,440,915 B2 | 5/2013 | Nagamatsu et al. |
| 8,692,129 B2 | 4/2014 | Kasai et al. |
| 8,803,323 B2 | 8/2014 | Yu et al. |
| 9,040,838 B2 | 4/2015 | Eblanc et al. |

(Continued)

FOREIGN PATENT DOCUMENTS

KR    10-2019-0052526    5/2019

*Primary Examiner* — Fernando L Toledo
*Assistant Examiner* — Neil R Prasad
(74) *Attorney, Agent, or Firm* — F. Chau & Associates, LLC

(57) ABSTRACT

A semiconductor package including: a first substrate including a first surface including a first region and a second region at least partially surrounding the first region, wherein the first substrate includes a first insulating layer, a first conductive pattern in the first insulating layer, a first passivation layer disposed in the first region and the second region, and a second passivation layer disposed on the first passivation layer in the second region; an interposer overlapping the first substrate and including a second insulating layer and a second conductive pattern in the second insulating layer; a first connection terminal disposed on the first passivation layer in the first region; and a second connection terminal disposed on the second passivation layer in the second region, wherein the first conductive pattern and the second conductive pattern are connected to each other through the first connection terminal and the second connection terminal.

20 Claims, 23 Drawing Sheets

(56) References Cited

U.S. PATENT DOCUMENTS

| | | | |
|---|---|---|---|
| 9,355,898 B2 | 5/2016 | Kumar et al. | |
| 10,147,674 B2 | 12/2018 | Hsieh et al. | |
| 2003/0230804 A1* | 12/2003 | Kouno | H01L 23/49894 |
| | | | 257/734 |
| 2014/0103527 A1* | 4/2014 | Marimuthu | H01L 21/486 |
| | | | 257/737 |
| 2014/0183726 A1 | 7/2014 | Lee et al. | |
| 2018/0350772 A1* | 12/2018 | Nair | H01L 23/66 |

* cited by examiner

SEMICONDUCTOR PACKAGE

CROSS-REFERENCE TO RELATED APPLICATION

This application claims priority under 35 U.S.C. § 119 to Korean Patent Application No. 10-2020-0125460 filed on Sep. 28, 2020 in the Korean Intellectual Property Office, the disclosure of which is incorporated by reference herein in its entirety.

TECHNICAL FIELD

The present inventive concept relates to a semiconductor package. More particularly, the present inventive concept relates to a semiconductor package including an interposer.

DISCUSSION OF THE RELATED ART

With the development of the electronic industry, the demand for electronic devices with increased functionality, increased speed and increased miniaturization is increasing. In line with this trend, a method of stacking and mounting a plurality of semiconductor chips on one package substrate or stacking a package on a package may be used. For example, a package-in-package (PIP) type semiconductor package or a package-on-package (POP) type semiconductor package may be manufactured.

Generally, the POP type semiconductor package may include an interposer for an electrical connection between an upper package and a lower package. The interposer may facilitate the connection between the upper package and the lower package, and prevent warpage of the upper package and the lower package.

SUMMARY

According to an exemplary embodiment of the present inventive concept, a semiconductor package including: a first substrate including a first surface including a first region and a second region at least partially surrounding the first region, wherein the first substrate includes a first insulating layer, a first conductive pattern in the first insulating layer, a first passivation layer disposed in the first region and the second region, and a second passivation layer disposed on the first passivation layer in the second region; an interposer overlapping the first substrate and including a second insulating layer and a second conductive pattern in the second insulating layer; a first connection terminal disposed on the first passivation layer in the first region; and a second connection terminal disposed on the second passivation layer in the second region, wherein the first conductive pattern and the second conductive pattern are connected to each other through the first connection terminal and the second connection terminal.

According to an exemplary embodiment of the present inventive concept, a semiconductor package including: a first substrate including a first surface, a first insulating layer, a first conductive pattern in the first insulating layer, and a first passivation layer disposed on the first surface; a first semiconductor chip disposed on the first surface and electrically connected to the first conductive pattern of the first substrate through a first connection terminal in the first passivation layer; an interposer overlapping the first surface and including a second surface facing the first surface, wherein the interposer includes a second insulating layer, a second conductive pattern in the second insulating layer, and a second passivation layer disposed on the second surface; and a second connection terminal including a first connection pillar penetrating the first passivation layer to be connected to the first conductive pattern, a second connection pillar penetrating the second passivation layer to be connected to the second conductive pattern, and a first connection ball connecting the first connection pillar to the second connection pillar, wherein a thickness of the first passivation layer on which the second connection terminal is disposed is greater than a thickness of the first passivation layer on which the first semiconductor chip is disposed.

According to an exemplary embodiment of the present inventive concept, a semiconductor package including: a first substrate including a first surface, the first substrate including a first insulating layer, a first conductive pattern in the first insulating layer, and a plurality of first passivation layers disposed on the first surface; a first semiconductor chip mounted on the first surface of the first substrate; an interposer overlapping the first surface of the first substrate, and spaced apart from the first semiconductor chip, wherein the interposer includes a second surface facing the first surface of the first substrate, a second insulating layer, a second conductive pattern in the second insulating layer, and a plurality of second passivation layers disposed on the second surface; a first connection terminal disposed between the first passivation layers and the second passivation layers, wherein the first connection terminal penetrates the first and second passivation layers to electrically connect the first conductive pattern to the second conductive pattern; a second substrate disposed on a third surface opposite to the second surface of the interposer; a second semiconductor chip mounted on the second substrate; and a second connection terminal disposed between the interposer and the second substrate, and electrically connecting the interposer to the second substrate, wherein the first semiconductor chip is spaced apart from the plurality of first passivation layers.

According to an exemplary embodiment of the present inventive concept, a semiconductor package including: a first substrate including a first surface and a second surface including a first region and a second region different from the first region, wherein the first substrate includes a first insulating layer, a first conductive pattern in the first insulating layer, and a plurality of connection pads connected to the first conductive pattern and disposed on the second surface; an interposer disposed overlapping the first substrate and including a second insulating layer and a second conductive pattern in the second insulating layer; a connector disposed on the first surface of the first substrate and directly connecting the first conductive pattern of the first substrate to the second conductive pattern of the interposer; a first passivation layer disposed on the second surface in the first region and the second region; a second passivation layer disposed on the first passivation layer in the second region without extending along the first region; a first connection terminal disposed on the first passivation layer in the first region and connected to a first connection pad of the plurality of connection pads; and a second connection terminal disposed on the second passivation layer in the second region and connected to a second connection pad of the plurality of connection pads.

BRIEF DESCRIPTION OF THE DRAWINGS

The above and other features of the present inventive concept will become more apparent by describing in detail exemplary embodiments thereof, with reference to the accompanying drawings, in which.

DETAILED DESCRIPTION OF THE EMBODIMENTS

Hereinafter, exemplary embodiments of the present inventive concept will be described with reference to the accompanying drawings.

Figure 1:
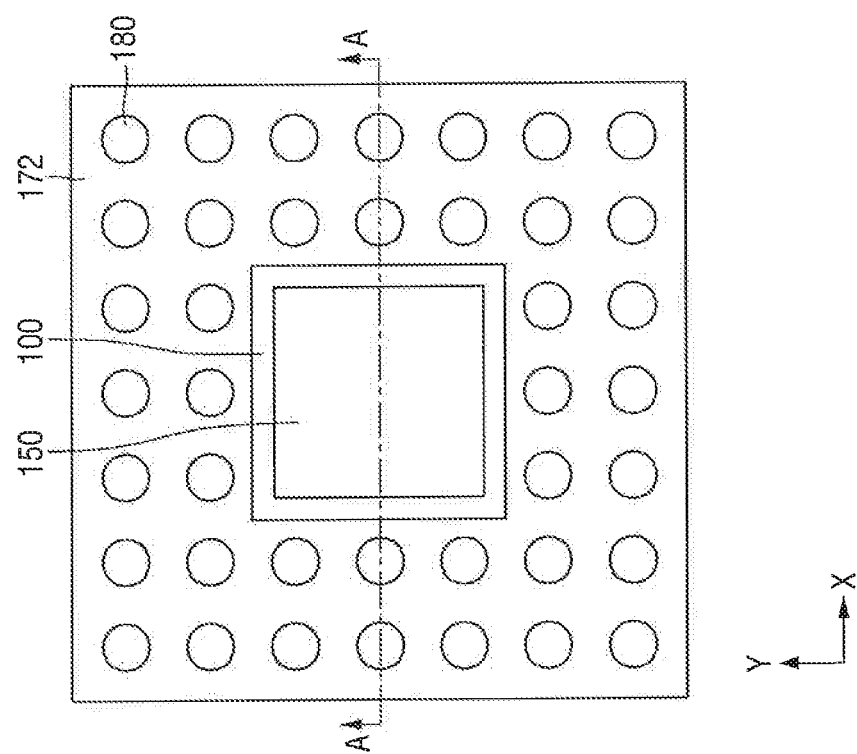
FIG. 1 is a layout diagram of a semiconductor package according to an exemplary embodiment of the present inventive concept.
Figure 2:
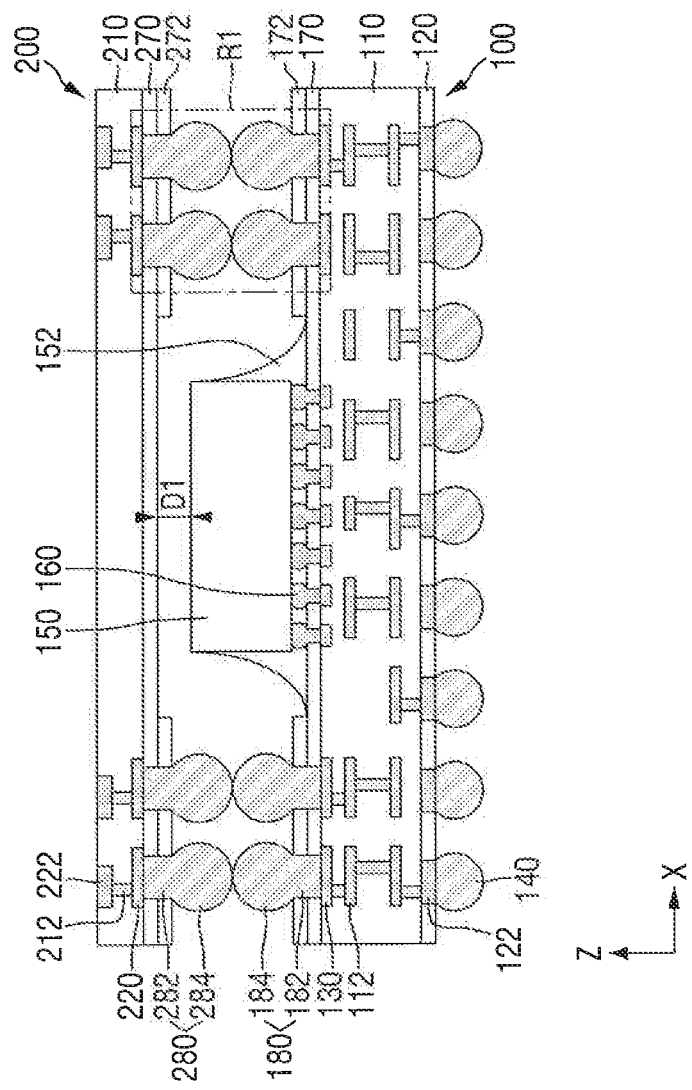
FIG. 2 is a schematic cross-sectional view taken along line A-A of FIG. 1.
Figure 3:
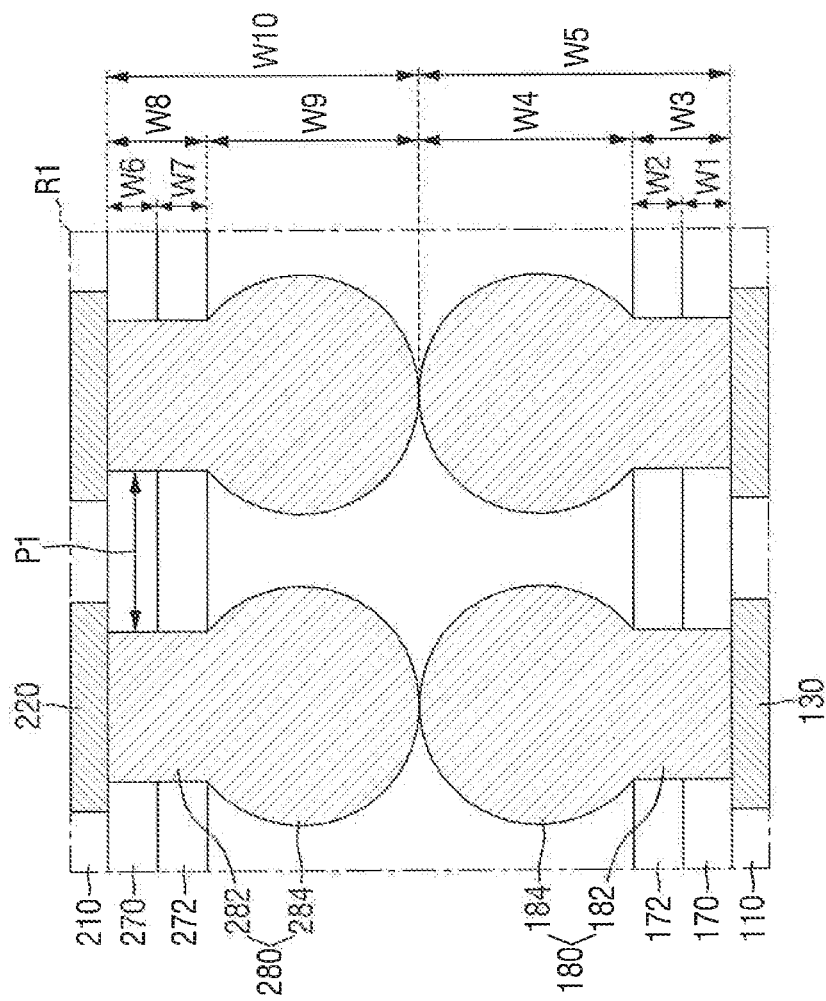
FIGS. 3, 4A, and 4B are enlarged views illustrating a first region of FIG. 2.
Figure 4A:
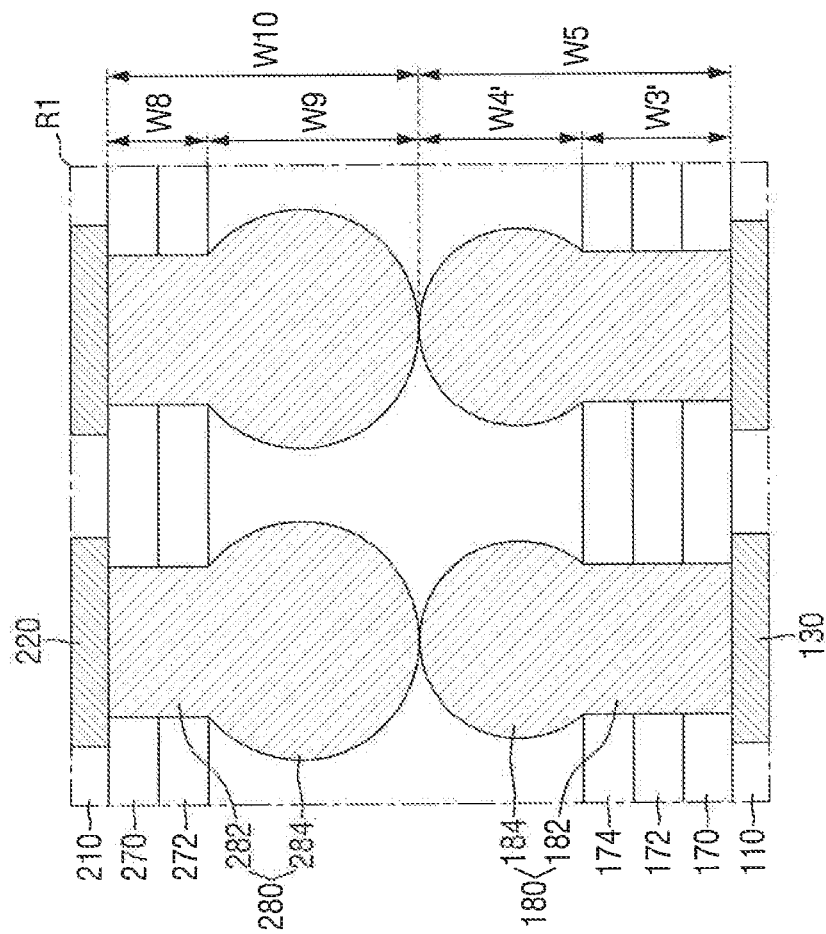
Figure 4B:
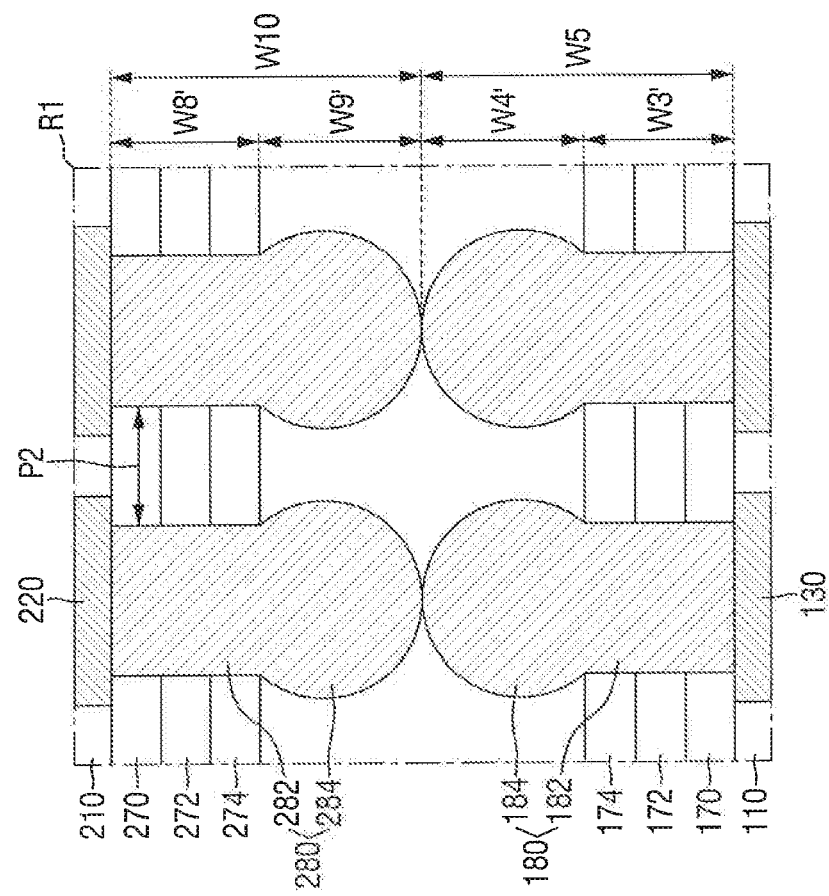

FIG. 1 is a layout diagram of a semiconductor package according to an exemplary embodiment of the present inventive concept. FIG. 2 is a schematic cross-sectional view taken along line A-A of FIG. 1. FIGS. 3, 4A, and 4B are enlarged views illustrating a first region of FIG. 2.

Referring to FIGS. 1 to 4B, the semiconductor package according to an exemplary embodiment of the present inventive concept may include a first substrate 100, a first semiconductor chip 150, an interposer 200, a first connection terminal 180, and a second connection terminal 280.

The first substrate 100 may be a package substrate. For example, the first substrate 100 may be a printed circuit board (PCB), a ceramic substrate, or the like. In addition, the first substrate 100 may be a wafer level package (WLP) substrate fabricated at a wafer level. The first substrate 100 may include a bottom surface and a top surface opposite to each other.

The first substrate 100 may include an insulating layer 110, a conductive pattern 112, a passivation layer 120, a lower pad 122, an upper pad 130, a first passivation layer 170, and a second passivation layer 172.

The conductive pattern 112 may be in the insulating layer 110 and may electrically connect the lower pad 122 to the upper pad 130. The insulating layer 110 and the conductive pattern 112 may constitute a wiring pattern. The insulating layer 110 is illustrated as a single layer, but exemplary embodiments of the present disclosure are not limited thereto. For example, the insulating layer 110 may be multilayered, and the conductive pattern 112 may also be multilayered.

The passivation layer 120 and the lower pad 122 may be formed on the insulating layer 110. For example, the passivation layer 120 and the lower pad 122 may be formed on the bottom surface of the insulating layer 110. The lower pad 122 may be electrically connected to the conductive pattern 112. For example, the passivation layer 120 may cover the bottom surface of the insulating layer 110. The passivation layer 120 may expose at least a portion of the lower pad 122.

In an exemplary embodiment of the present inventive concept, a connection terminal 140 may be formed on the bottom surface of the first substrate 100. The connection terminal 140 may be connected to the lower pad 122. For example, the connection terminal 140 may be connected directly to the lower pad 122. The connection terminal 140 may be, for example, a spherical or ellipsoidal shape, but exemplary embodiments of the present inventive concept are not limited thereto. The connection terminal 140 may include, for example, tin (Sn), indium (In), bismuth (Bi), antimony (Sb), copper (Cu), silver (Ag), zinc (Zn), lead (Pb), or a combination thereof.

The connection terminal 140 may electrically connect the first substrate 100 to an external device. The connection terminal 140 may provide an electrical signal to the first substrate 100. The connection terminal 140 may provide an electrical signal received from the first substrate 100 to the external device.

The upper pad 130, the first passivation layer 170, and the second passivation layer 172 may be formed on the insulating layer 110. For example, the upper pad 130, the first passivation layer 170, and the second passivation layer 172 may be formed on the top surface of the insulating layer 110. The upper pad 130 may be formed on the insulating layer 110. The upper pad 130 may be formed on the top surface of the insulating layer 110. The upper pad 130 may be at least partially surrounded by the insulating layer 110, and the top surface of the upper pad 130 may be at least partially exposed from the top surface of the insulating layer 110.

The first passivation layer 170 may cover the top surface of the insulating layer 110. For example, the first passivation layer 170 may entirely cover the top surface of the insulating layer 110. The first passivation layer 170 may expose the top surface of the upper pad 130. For example, the first passivation layer 170 may only partially cover the upper pad 130. For example, the first passivation layer 170 may include a trench exposing the upper pad 130. For example, the upper pad 130 may be disposed in the trench of the first passivation layer 170.

The second passivation layer 172 may cover the first passivation layer 170. Referring to FIGS. 1 and 2, the second passivation layer 172 may partially cover the top surface of the first passivation layer 170. The second passivation layer 172 may be formed along the edge of the first passivation layer 170.

The second passivation layer 172 may at least partially expose the top surface of the upper pad 130. For example, the second passivation layer 172 may only partially cover the upper pad 130. For example, the second passivation layer 172 may include a trench or an opening exposing the upper pad 130. For example, as the trenches are respectively formed in the first and second passivation layers 170 and 172, the upper pad 130 may be exposed. For example, the trenches of the second passivation layer 172 may be aligned with the trenches of the first passivation layer 170.

The first and second passivation layers 170 and 172 may include, for example, a photoimageable dielectric (PID) material or a solder resist layer. However, the present inventive concept are not limited thereto.

The first semiconductor chip 150 may be disposed on the first substrate 100. For example, the first semiconductor chip 150 may be mounted on the top surface of the first substrate 100. For example, the first semiconductor chip 150 may be an integrated circuit (IC) chip having hundreds to millions of semiconductor elements integrated therein. For example, the first semiconductor chip 150 may be an application processor (AP) such as a central processing unit (CPU), a graphics processing unit (GPU), a field programmable gate array (FPGA), a digital signal processor, a cryptographic processor, a microprocessor, and a microcontroller, but the present inventive concept is not limited thereto. For example, the first semiconductor chip 150 may be a logic chip such as an analog-to-digital converter (ADC) or an application-specific integrated circuit (ASIC), or a memory chip such as a volatile memory (e.g., a dynamic random-access memory (DRAM)) or a nonvolatile memory (e.g., a read-only memory (ROM) or flash memory). Further, the first semiconductor chip 150 may be configured with a combination thereof.

The first semiconductor chip 150 may be disposed on the first passivation layer 170. The first semiconductor chip 150 may not be disposed on the second passivation layer 172. For example, the first semiconductor chip 150 may be disposed in a space formed by the top surface of the first passivation layer 170 and the sidewall of the second passivation layer 172.

Although it is illustrated that only one first semiconductor chip 150 is formed on the first substrate 100, this is merely an example. For example, a plurality of first semiconductor chips 150 may be formed side by side on the first substrate 100, or a plurality of first semiconductor chips 150 may be sequentially stacked on the first substrate 100.

In an exemplary embodiment of the present inventive concept, the first semiconductor chip 150 may be mounted on the first substrate 100 by a flip chip bonding method. For example, a solder bump 160 may be formed between the top surface of the first substrate 100 and the bottom surface of the first semiconductor chip 150. The solder bump 160 may electrically connect the first semiconductor chip 150 to the first substrate 100. For example, the solder bump 160 may electrically connect the conductive pattern 112 to the first semiconductor chip 150.

The solder bump 160 may penetrate the first passivation layer 170 to connect the first semiconductor chip 150 to the conductive pattern 112. The solder bump 160 may not penetrate the second passivation layer 172.

The solder bump 160 may include, for example, copper (Cu), a copper alloy, nickel (Ni), a nickel alloy, palladium (Pd), platinum (Pt), gold (Au), cobalt (Co), or a combination thereof, but the present inventive concept is not limited thereto.

The first connection terminal 180 may be formed on the first substrate 100. The first connection terminal 180 may be formed on the upper pad 130. The first connection terminal 180 may include a first connection pillar 182 and a first connection ball 184.

The first connection pillar 182 may have a pillar shape extending from the upper pad 130. The first connection pillar 182 may penetrate the first and second passivation layers 170 and 172. The first connection pillar 182 may be formed in the trenches of the first and second passivation layers 170 and 172. For example, the first connection pillar 182 may fill the trenches of the first and second passivation layers 170 and 172. The first connection pillar 182 may include copper (Cu), a copper alloy, nickel (Ni), a nickel alloy, palladium (Pd), platinum (Pt), gold (Au), cobalt (Co), or a combination thereof.

The first connection ball 184 may be formed on the first connection pillar 182. Although the first connection ball 184 is illustrated in a spherical or ellipsoidal shape, the present inventive concept are not limited thereto. The first connection ball 184 may include, for example, tin (Sn), indium (In), bismuth (Bi), antimony (Sb), copper (Cu), silver (Ag), zinc (Zn), lead (Pb), or a combination thereof.

The first connection terminal 180 may be in contact with the upper pad 130, and electrically connected to the upper pad 130, the conductive pattern 112, the lower pad 122, and the connection terminal 140.

The interposer 200 may be disposed on the first substrate 100. For example, the interposer 200 may be disposed above the top surface of the first substrate 100. The interposer 200 may include a bottom surface and a top surface opposite to each other. For example, the bottom surface of the interposer 200 may face the top surface of the first substrate 100.

In an exemplary embodiment of the present inventive concept, the interposer 200 may be spaced apart from the first substrate 100. For example, a distance from the top surface of the first substrate 100 to the bottom surface of the interposer 200 may be about 120 µm to about 200 µm. However, present inventive concept is not limited thereto.

In an exemplary embodiment of the present inventive concept, the interposer 200 may be spaced apart from the first semiconductor chip 150. For example, a distance D1 from the top surface of the first semiconductor chip 150 to the bottom surface of the interposer 200 may be about 15 µm to about 45 µm. However, the present inventive concept is not limited thereto.

The interposer 200 may include an insulating layer 210, a conductive pattern 212, a lower pad 220, an upper pad 222, a third passivation layer 270, and a fourth passivation layer 272.

The conductive pattern 212 may be disposed in the insulating layer 210 and may electrically connect the lower pad 220 to the upper pad 222. The insulating layer 210 and the conductive pattern 212 may constitute a wiring pattern. Although the insulating layer 210 is illustrated as a single layer, the present inventive concept is not limited thereto. For example, the insulating layer 210 may be multilayered, and the conductive pattern 212 may also be multilayered.

The lower pad 220, the third passivation layer 270, and the fourth passivation layer 272 may be formed on the bottom surface of the insulating layer 210. The lower pad 220 may be formed on the insulating layer 210. For example, the lower pad 220 may be formed on the bottom surface of the insulating layer 210. The lower pad 220 may be surrounded by the insulating layer 210, and the bottom surface of the lower pad 220 may be at least partially exposed from the bottom surface of the insulating layer 210.

The third passivation layer 270 may cover the bottom surface of the insulating layer 210. For example, the third passivation layer 270 may entirely cover the bottom surface of the insulating layer 210.

The fourth passivation layer 272 may cover the third passivation layer 270. The fourth passivation layer 272 may cover the bottom surface of the third passivation layer 270. The fourth passivation layer 272 may at least partially cover the third passivation layer 270.

The fourth passivation layer 272 may expose the bottom surface of the third passivation layer 270. For example, the fourth passivation layer 272 may only partially cover the third passivation layer 270. For example, the fourth passivation layer 272 may include a trench exposing the third passivation layer 270.

The third and fourth passivation layers 270 and 272 may include, for example, a photoimageable dielectric (PID) material or a solder resist layer. However, the present inventive concept is not limited thereto.

The second connection terminal 280 may be formed on the interposer 200. For example, second connection terminal 280 may be disposed on the bottom surface of the interposer 200. The second connection terminal 280 may be formed on the lower pad 220. The second connection terminal 280 may include a second connection pillar 282 and a second connection ball 284.

The second connection pillar 282 may extend from the lower pad 220. For example, the second connection pillar 282 may have a pillar shape. The second connection pillar 282 may penetrate the third and fourth passivation layers 270 and 272. The second connection pillar 282 may be formed in trenches of the third and fourth passivation layers 270 and 272. For example, the second connection pillar 282 may fill the trenches of the third and fourth passivation layers 270 and 272. The second connection pillar 282 may include, for example, copper (Cu), a copper alloy, nickel (Ni), a nickel alloy, palladium (Pd), platinum (Pt), gold (Au), cobalt (Co), or a combination thereof.

The second connection ball 284 may be formed on the second connection pillar 282. Although the second connection ball 284 is illustrated as having a spherical or ellipsoidal shape, the present inventive concept is not limited thereto. The second connection ball 284 may include, for example, tin (Sn), indium (In), bismuth (Bi), antimony (Sb), copper (Cu), silver (Ag), zinc (Zn), lead (Pb), or a combination thereof.

The second connection terminal 280 may be in contact with the lower pad 220 and electrically connected to the lower pad 220, the conductive pattern 212 and the upper pad 222.

An underfill 152 may be formed along the outer wall of the first semiconductor chip 150. The underfill 152 may fill a space between the first substrate 100 and the first semiconductor chip 150. The underfill 152 may prevent breakage of the first semiconductor chip 150 by fixing the first semiconductor chip 150 on the first substrate 100. The underfill 152 may cover the solder bump 160.

The underfill 152 may fill the space defined by the top surface of the first passivation layer 170 and the sidewall of the second passivation layer 172. For example, the second passivation layer 172 may function as a dam that prevents an overflow of the underfill 152.

The underfill 152 may include an insulating polymer material such as an epoxy molding compound (EMC).

The first connection terminal 180 may be in contact with the second connection terminal 280. For example, the first connection ball 184 of the first connection terminal 180 may correspond to the second connection ball 284 of the second connection terminal 280. For example, in a packaging process, the first substrate 100 and the first connection terminal 180 may be arranged to correspond with the interposer 200 and the second connection terminal 280.

Referring to FIG. 3, the thickness of the first passivation layer 170 may be a first thickness W1. The thickness of the second passivation layer 172 may be a second thickness W2. The thickness of the first connection pillar 182 may be a third thickness W3. The thickness of the first connection ball 184 may be a fourth thickness W4. The thickness of the first connection terminal 180 may be a fifth thickness W5.

The sum of the first thickness W1 and the second thickness W2 may be equal to the third thickness W3. The sum of the third thickness W3 and the fourth thickness W4 may be equal to the fifth thickness W5.

The thickness of the third passivation layer 270 may be a sixth thickness W6. The thickness of the fourth passivation layer 272 may be a seventh thickness W7. The thickness of the second connection pillar 282 may be an eighth thickness W8. The thickness of the second connection ball 284 may be a ninth thickness W9. The thickness of the second connection terminal 280 may be a tenth thickness W10.

The sum of the sixth thickness W6 and the seventh thickness W7 may be equal to the eighth thickness W8. The sum of the eighth thickness W8 and the ninth thickness W9 may be equal to the tenth thickness W10.

In FIG. 3, a distance between the first connection terminals 180 may be a first pitch P1. Further, a distance between the second connection terminals 280 may be the first pitch P1. However, the present inventive concept is not limited thereto.

Referring to FIG. 4A, the semiconductor package may further include a fifth passivation layer 174. The fifth passivation layer 174 may be formed on the second passivation layer 172. For example, three passivation layers 170, 172 and 174 may be arranged on the top surface of the first substrate 100, and two passivation layers 270 and 272 may be arranged on the bottom surface of the interposer 200. For example, different numbers of the passivation layers may be formed on the first substrate 100 and the interposer 200.

The first connection pillar 182 may be formed to penetrate the first passivation layer 170, the second passivation layer 172, and the fifth passivation layer 174.

In FIG. 4A, the thickness of the first connection pillar 182 may be a third thickness W3. The thickness of the first connection ball 184 may be a fourth thickness W4'. The fourth thickness W4' of the first connection ball 184 may be smaller than the ninth thickness W9 of the second connection ball 284. For example, the thickness of the first connection ball 184 may be different from the thickness of the second connection ball 284.

Referring to FIG. 4B, the semiconductor package may further include the fifth passivation layer 174 and a sixth passivation layer 274. The fifth passivation layer 174 may be formed on the second passivation layer 172. The sixth passivation layer 274 may be formed on the fourth passivation layer 272.

The first connection pillar 182 may be formed to penetrate the first passivation layer 170, the second passivation layer 172, and the fifth passivation layer 174. The second connection pillar 282 may be formed to penetrate the third passivation layer 270, the fourth passivation layer 272, and the sixth passivation layer 274.

In FIG. 4B, the thickness of the first connection pillar 182 may be the third thickness W3'. The thickness of the first connection ball 184 may be the fourth thickness W4'. The thickness of the second connection pillar 282 may be an eighth thickness W8'. The thickness of the second connection ball 284 may be a ninth thickness W9'.

The distance between the first connection terminals 180 may be a second pitch P2. Further, the distance between the second connection terminals 280 may be the second pitch P2. However, the present inventive concept is not limited thereto.

Referring to FIGS. 3 and 4B, the fourth thickness W4' of the first connection ball 184 may be smaller than the fourth thickness W4 (see FIG. 3) of the first connection ball 184. Further, the ninth thickness W9' of the second connection ball 284 may be smaller than the ninth thickness W9 (see FIG. 3) of the second connection ball 284. Furthermore, the second pitch P2 may be smaller than the first pitch P1 (See FIG. 3).

As the semiconductor package includes the stacked fifth passivation layer 174 and the stacked sixth passivation layer 274, the thicknesses of the first and second connection balls 184 and 284 may be decreased. In addition, as the thicknesses of the first and second connection balls 184 and 284 are decreased, the first pitch P1 may be changed to the second pitch P2. For example, more first connection terminals 180 and more second connection terminals 280 may be disposed and integrated in the same space.

Figure 5:
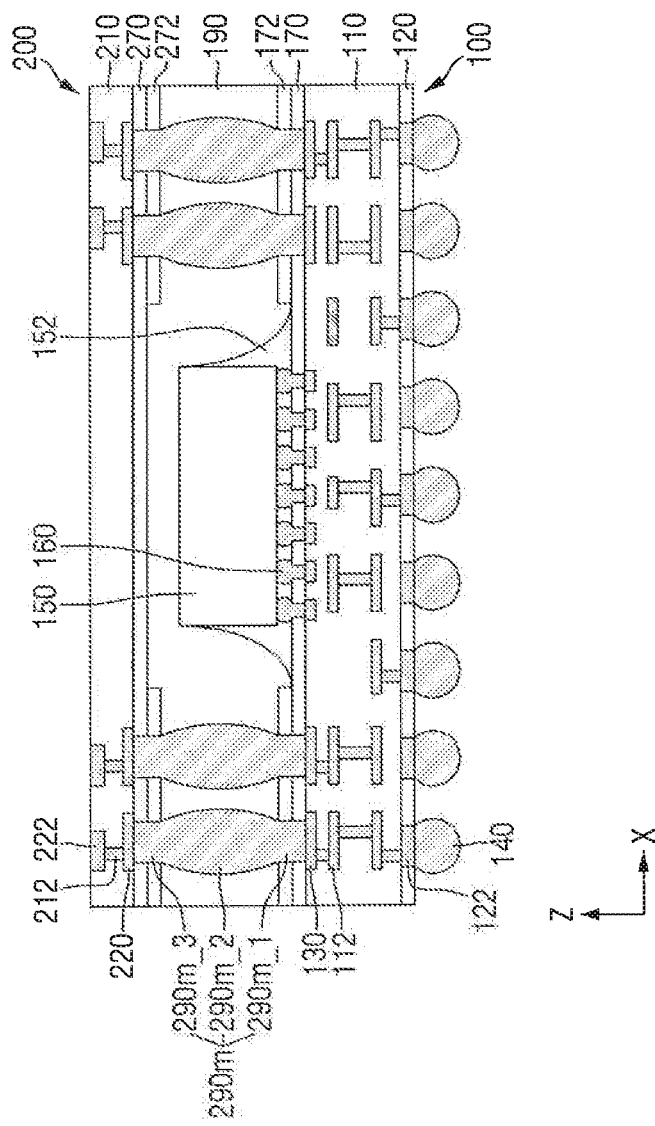
FIG. 5 is a schematic cross-sectional view of a semiconductor package according to an exemplary embodiment of the present inventive concept.

FIG. 5 is a schematic cross-sectional view of a semiconductor package according to an exemplary embodiment of the present inventive concept.

Referring to FIG. 5, the first substrate 100, the interposer 200, the first connection terminal 180, and the second connection terminal 280 shown in FIG. 2 may be subjected to heat. For example, a reflow process may be performed on the semiconductor package including the first substrate 100, the interposer 200, the first connection terminal 180, and the second connection terminal 280. Accordingly, the first connection terminal 180 may be merged with the second connection terminal 280 so that a merged connection terminal 290m may be formed.

The merged connection terminal 290m may extend in a vertical direction. For example, the merged connection terminal 290m may have a cylindrical shape, a cuboid shape or a pillar shape. The merged connection terminal 290m may connect the upper pad 130 to the lower pad 220. Further, the merged connection terminal 290m may electrically connect the upper pad 130 to the lower pad 220.

The merged connection terminal 290m may include a first connection pillar 290m_1, a connection ball 290m_2, and a second connection pillar 290m_3. The first connection pillar 290m_1, the connection ball 290m_2, and the second connection pillar 290m_3 may be continuously connected. For example, the first connection pillar 290m_1, the connection ball 290m_2, and the second connection pillar 290m_3 may be single body. The first connection pillar 290m_1 may be formed in the first and second passivation layers 170 and 172 with the pillar shape. The second connection pillar 290m_3 may be formed in the third and fourth passivation layers 270 and 272 with the pillar shape. The connection ball 290m_2 may be formed between the first and second connection pillars 290m_1 and 290m_3 in a spherical or ellipsoidal shape. However, the present inventive concept is not limited thereto, and for example, the first connection pillar 290m_1, and the connection ball 290m_2, and the second connection pillar 290m_3 may have different shapes from each other.

Here, as the semiconductor package includes the plurality of passivation layers (e.g., the first to fourth passivation layers 170, 172, 270, and 272), the contact failure can be reduced when the first substrate 100 is connected to the interposer 200. Accordingly, it is possible to provide a semiconductor package, in which the connection between the interposer 200 and the first substrate 100 is increased.

In an exemplary embodiment of the present inventive concept, a molding layer 190 may be formed on the first substrate 100. The molding layer 190 may fill a space between the first substrate 100 and the interposer 200. Therefore, the molding layer 190 may cover and protect the first substrate 100, the first semiconductor chip 150, the solder bump 160, and the merged connection terminal 290m. The merged connection terminal 290m may penetrate the molding layer 190 to electrically connect the first substrate 100 to the interposer 200 to each other.

The molding layer 190 may include an insulating polymer material such as an EMC, but the present inventive concept is not limited thereto.

Figure 6:
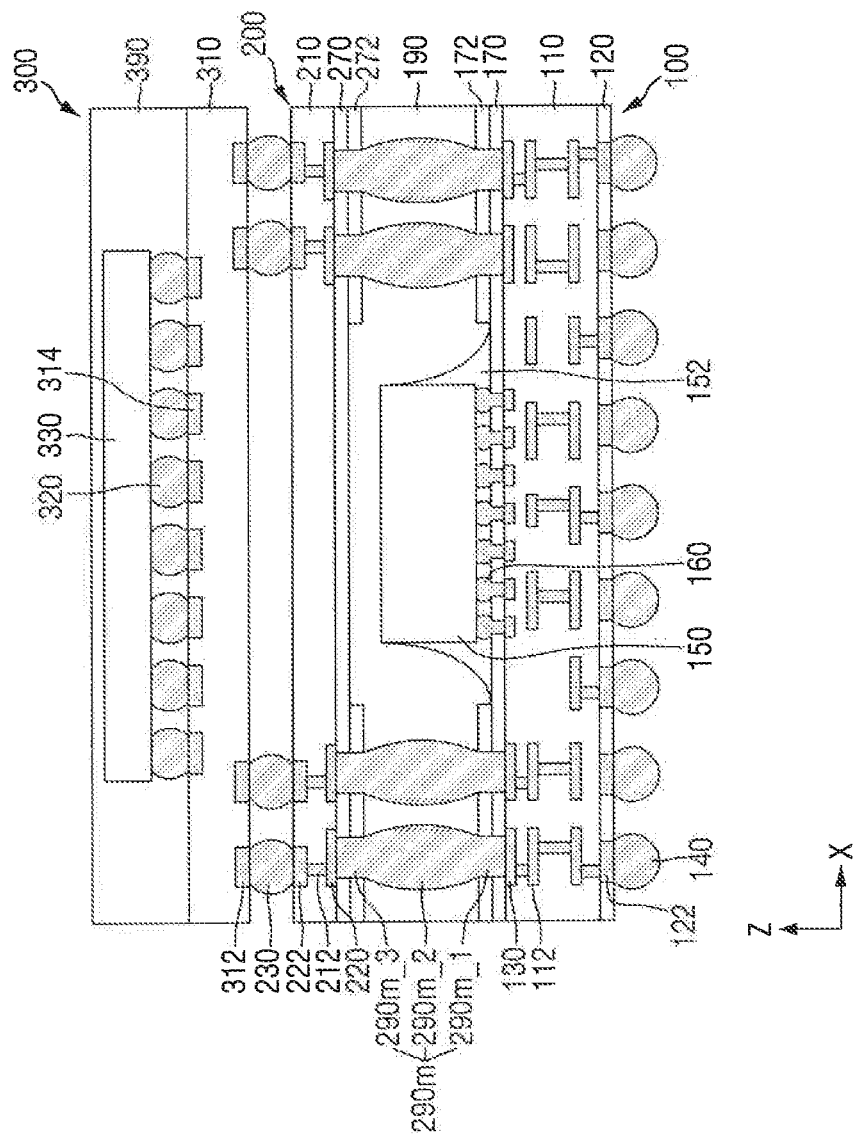
FIG. 6 is a schematic cross-sectional view of a semiconductor package according to an exemplary embodiment of the present inventive concept.

FIG. 6 is a schematic cross-sectional view of a semiconductor package according to an exemplary embodiment of the present inventive concept.

Referring to FIG. 6, a second substrate 300 may be disposed above the top surface of the interposer 200. The second substrate 300 may be a package substrate. For example, the second substrate 300 may be a printed circuit board (PCB) or a ceramic substrate. In addition, the second substrate 300 may also be a wafer level package (WLP) substrate fabricated at a wafer level. The second substrate 300 may include a bottom surface and a top surface opposite to each other. For example, the bottom surface of the second substrate 300 may face the top surface of the interposer 200.

The second substrate 300 may include an insulating layer 310, a lower pad 312, an upper pad 314, a connection terminal 320, and the like.

The lower pad 312 may be disposed on the bottom surface of the insulating layer 310. The lower pad 312 may be exposed from the bottom surface of the insulating layer 310. The upper pad 314 may be disposed on the top surface of the insulating layer 310. The upper pad 314 may be exposed from the top surface of the insulating layer 310. The lower pad 312 may be electrically connected to the upper pad 314 via a conductive pattern included in the insulating layer 310.

A connection terminal 230 may connect the interposer 200 to the second substrate 300. The connection terminal 230 may be disposed between the upper pad 222 of the interposer 200 and the lower pad 312 of the second substrate 300. The connection terminal 230 may electrically connect the upper pad 222 to the lower pad 312. The connection terminal 230 may be, for example, a spherical or ellipsoidal shape, but present inventive concept is not limited thereto. The connection terminal 230 may include, for example, tin (Sn), indium (In), bismuth (Bi), antimony (Sb), copper (Cu), silver (Ag), zinc (Zn), lead (Pb), or a combination thereof, but the present inventive concept is not limited thereto.

A second semiconductor chip 330 may be disposed on the second substrate 300. For example, the second semiconductor chip 330 may be mounted on the second substrate 300. For example, the second semiconductor chip 330 may be disposed on the top surface of the insulating layer 310. For example, the second semiconductor chip 330 may be an integrated circuit (IC) chip having hundreds to millions of semiconductor elements integrated therein.

In an exemplary embodiment of the present inventive concept, the first semiconductor chip 150 may be a logic chip such as an application processor (AP), and the second semiconductor chip 330 may be a memory chip such as a volatile memory (e.g., DRAM) or nonvolatile memory (e.g., ROM or flash memory).

Although it is illustrated that only one second semiconductor chip 330 is formed on the second substrate 300, this is merely for simplicity of description. For example, a plurality of second semiconductor chips 330 may be formed side by side on the second substrate 300, and/or a plurality of second semiconductor chips 330 may be sequentially stacked on the second substrate 300.

In an exemplary embodiment of the present inventive concept, the second semiconductor chip 330 may be mounted on the second substrate 300 by a flip chip bonding method. For example, the second semiconductor chip 330 may be mounted on the insulating layer 310 by the flip chip bonding method. For example, the connection terminal 320 may be formed between the top surface of the second substrate 300 and the bottom surface of the second semiconductor chip 330. For example, the connection terminal 320 may be formed between the top surface of the insulating layer 310 and the bottom surface of the second semiconductor chip 330. The connection terminal 320 may electrically connect the second substrate 300 to the second semiconductor chip 330.

In an exemplary embodiment of the present inventive concept, a molding layer 390 may be formed on the second substrate 300. For example, the molding layer 390 may be formed on the insulating layer 310. The molding layer 390 may cover and protect the second substrate 300, a second semiconductor chip 330, and the connection terminal 320. The molding layer 390 may include, for example, an insulating polymer material such as an EMC, but the present inventive concept is not limited thereto.

Hereinafter, a semiconductor package according to an exemplary embodiment of the present inventive concept will be described with reference to FIGS. 7 to 9.

Figure 7:
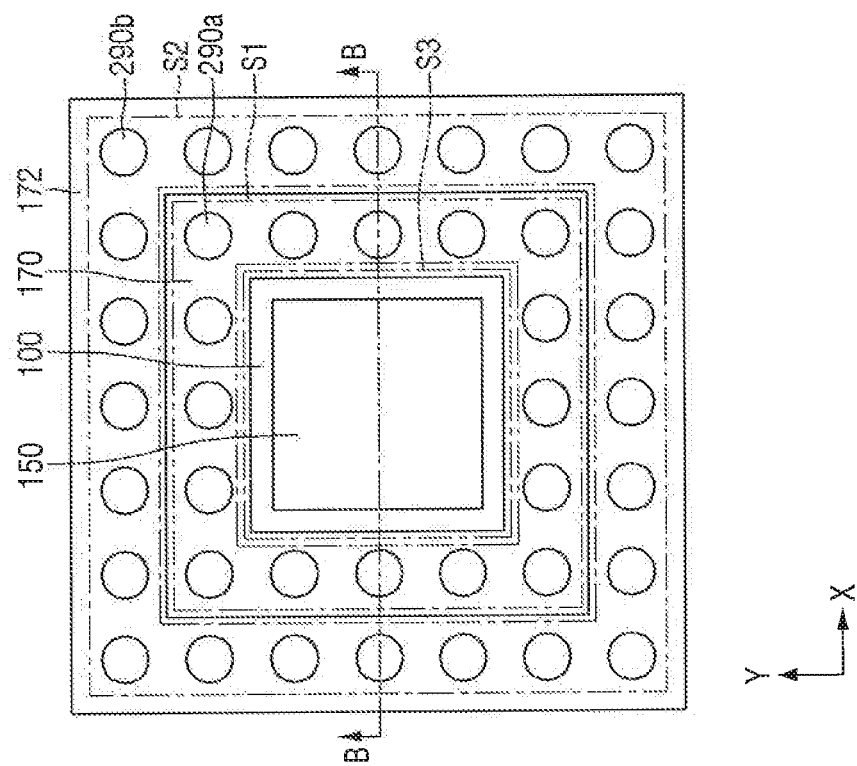
FIG. 7 is a layout diagram of a semiconductor package according to an exemplary embodiment of the present inventive concept.

FIG. 7 is a layout diagram of a semiconductor package according to an exemplary embodiment of the present inventive concept. FIG. 8 is a schematic cross-sectional view taken along line B-B of FIG. 7. FIG. 9 is an enlarged view illustrating a second region of FIG. 8. For simplicity of description, redundant parts of the description made with reference to FIGS. 1 to 6 will be recapitulated or omitted.

Figure 8:
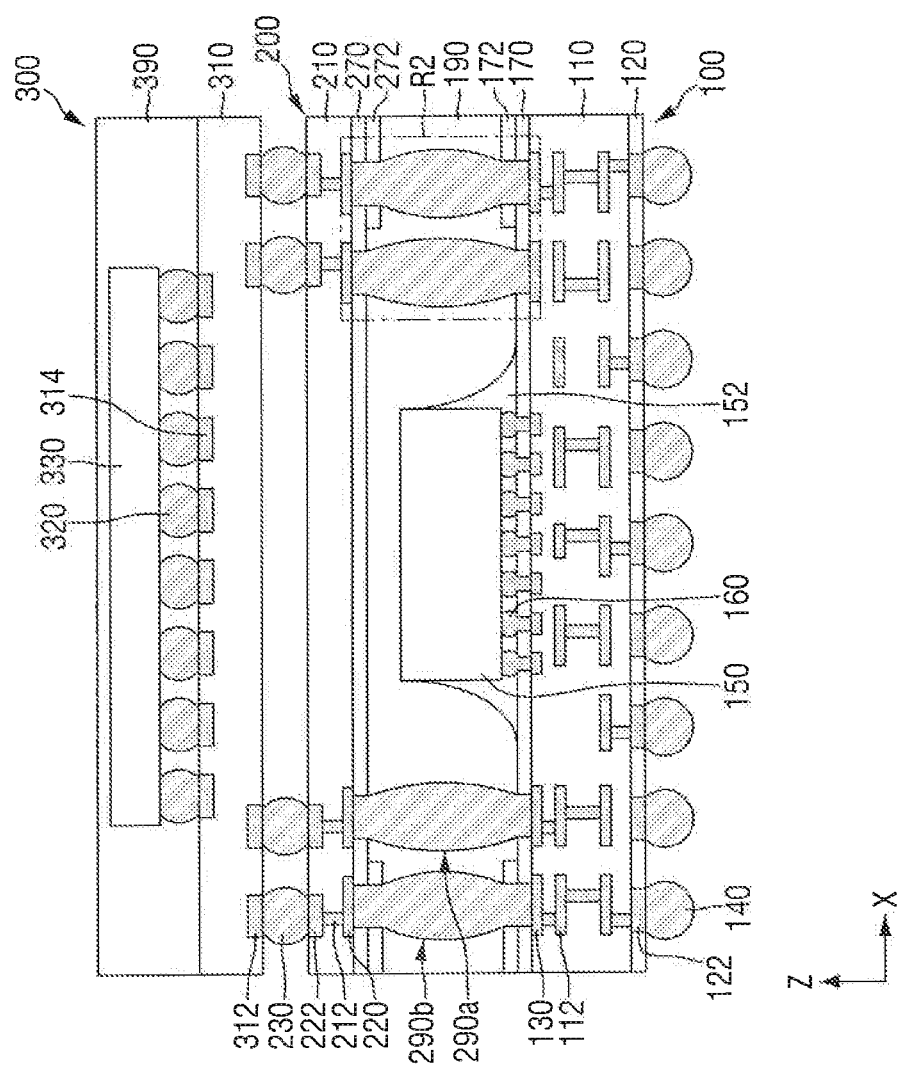
FIG. 8 is a schematic cross-sectional view taken along line B-B of FIG. 7.

Referring to FIGS. 7 and 8, the top surface of the first substrate 100 may include a third region S3, a first region S1 surrounding the third region S3, and a second region S2 surrounding the first region S1. For example, the third region S3 may be provided by the first semiconductor chip 150. As an additional example, the first region S1 may be provided by the first passivation layer 170, and the second region S2 may be provided by the second passivation layer 172. However, the present inventive concept is not limited thereto.

The first passivation layer 170 may cover the top surface of the first substrate 100. The first passivation layer 170 may cover the first and second regions S1 and S2 of the top surface of the first substrate 100. The first passivation layer 170 may not cover the third region S3. For example, the first passivation layer 170 may not be disposed under the first semiconductor chip 150. However, the present inventive concept is not limited thereto. For example, the first passivation layer 170 may at least partially cover the third region S3.

The second passivation layer 172 may cover the top surface of the first substrate 100. The second passivation layer 172 may cover at least the second region S2 of the top surface of the first substrate 100. For example, the second passivation layer 172 may cover only the second region S2 of the top surface of the first substrate 100. For example, the second passivation layer 172 may not cover the first and third regions S1 and S3.

The third passivation layer 270 may cover the bottom surface of the interposer 200. The third passivation layer 270 may cover the first and second regions S1 and S2 of the bottom surface of the interposer 200. For example, the third passivation layer 270 may not cover the third region S3. For example, the third passivation layer 270 may not overlap the first semiconductor chip 150. However, the present inventive concept is not limited thereto. For example, the third passivation layer 270 may cover the third region S3.

The fourth passivation layer 272 may cover the bottom surface of the interposer 200. The fourth passivation layer 272 may cover at least the second region S2 of the bottom surface of the interposer 200. For example, the fourth passivation layer 272 may cover only the second region S2 of the bottom surface of the interposer 200. For example, the fourth passivation layer 272 may not cover the first and third regions S1 and S3.

Figure 9:
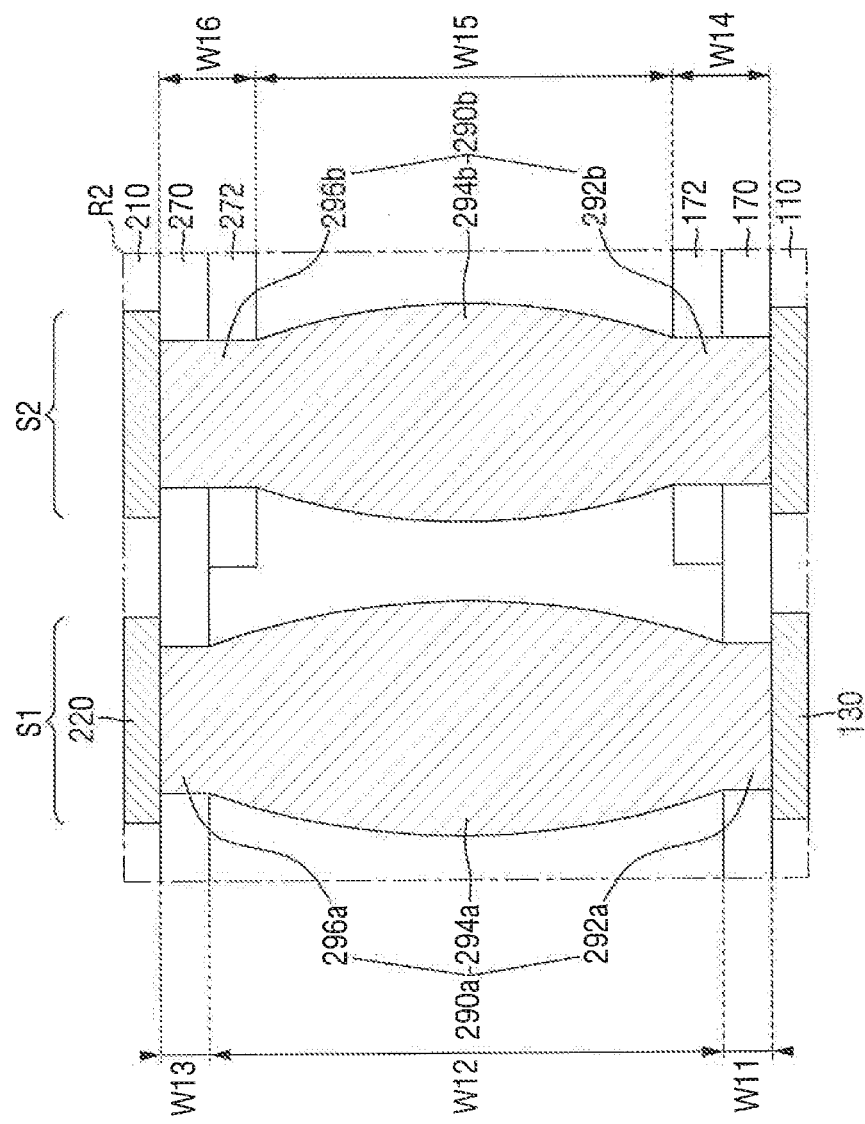
FIG. 9 is an enlarged view illustrating a second region of FIG. 8.

Referring to FIG. 9, the first and second passivation layers 170 and 172 may form a stepped portion. Further, the third and fourth passivation layers 270 and 272 may form a stepped portion. For example, a thickness W11 of the first passivation layer 170 located in the first region S1 may be smaller than a thickness W14 of the first and second passivation layers 170 and 172 located in the second region S2. Further, a thickness W13 of the third passivation layer 270 located in the first region S1 may be smaller than a thickness W16 of the third and fourth passivation layers 270 and 272 located in the second region S2.

In an exemplary embodiment of the present inventive concept, the first passivation layer 170 and the second passivation layer 172 may include the same material as each other and be formed in the same process. Accordingly, the first passivation layer 170 and the second passivation layer 172 may be a single layer, and the thickness in the first region S1 may be less than the thickness in the second region S2.

In an exemplary embodiment of the present inventive concept, the first passivation layer 170 may have a thickness in the first region S1 that is different from another thickness of the first passivation layer 170 in the second region S2.

In an exemplary embodiment of the present inventive concept, the third passivation layer 270 and the fourth passivation layer 272 may include the same material as each other and be formed in the same process. Accordingly, the third passivation layer 270 and the fourth passivation layer 272 may be a single layer, and the thickness in the first region S1 may be less than the thickness in the second region S2.

In an exemplary embodiment of the present inventive concept, the third passivation layer 270 may have a thickness in the first region S1 that is different from another thickness of the third passivation layer 270 in the second region S2.

A first connection terminal 290a may be disposed in the first region S1. The first connection terminal 290a may connect the upper pad 130 to the lower pad 220. The first connection terminal 290a may include a first connection pillar 292a, a first connection ball 294a, and a first connection pillar 296a. The first connection ball 294a may connect the first connection pillar 292a to the first connection pillar 296a.

A second connection terminal 290b may be disposed in the second region S2. The second connection terminal 290b may connect the upper pad 130 to the lower pad 220. The second connection terminal 290b may include a second connection pillar 292b, a second connection ball 294b, and a second connection pillar 296b. The second connection ball 294b may connect the second connection pillar 292b to the second connection pillar 296b.

A thickness W12 of the first connection ball 294a may be greater than a thickness W15 of the second connection ball 294b. For example, since the thickness W11 of the first passivation layer 170 located in the first region S1 and the thickness W13 of the third passivation layer 270 located in the first region S1 are smaller than the thickness W14 of the first and second passivation layers 170 and 172 located in the second region S2 and the thickness W16 of the third and fourth passivation layers 270 and 272 located in the second region S2, the thickness W12 of the first connection ball 294a may be greater than the thickness W15 of the second connection ball 294b.

For example, the thickness W12 of the first connection ball 294a positioned close to the first semiconductor chip 150 may be greater than the thickness W15 of the second connection ball 294b positioned further away from the first semiconductor chip 150. For example, as the second connection ball 294b is disposed on the outer top surface of the first substrate 100 between the first substrate 100 and the interposer 200, the warpage of the semiconductor package can be decreased.

Hereinafter, a semiconductor package according to an exemplary embodiment of the present inventive concept will be described with reference to FIGS. 10 to 12.

Figure 10:
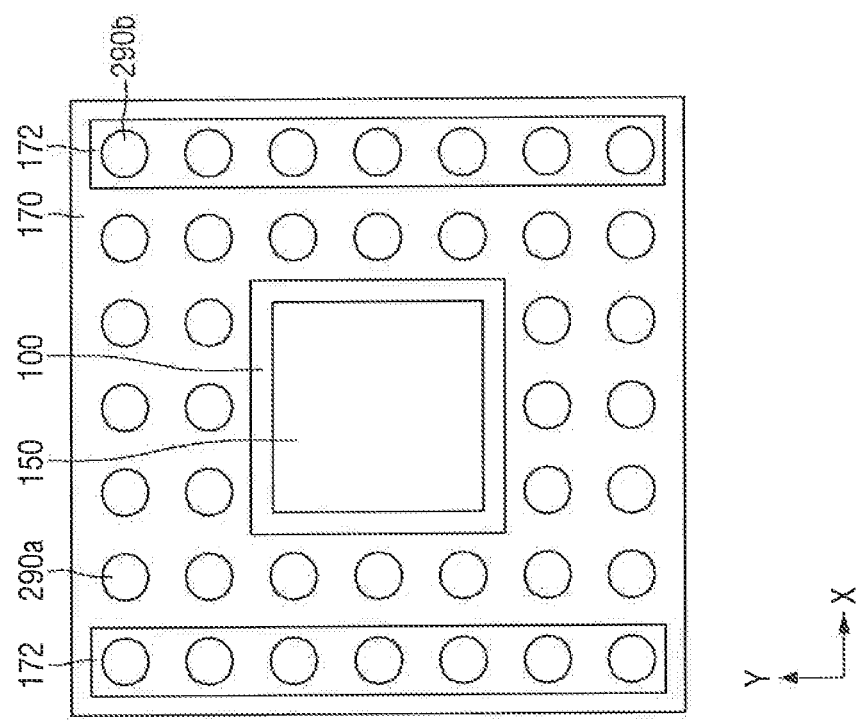
FIGS. 10, 11 and 12 illustrate layout diagrams of a semiconductor package according to an exemplary embodiment of the present inventive concept.
Figure 11:
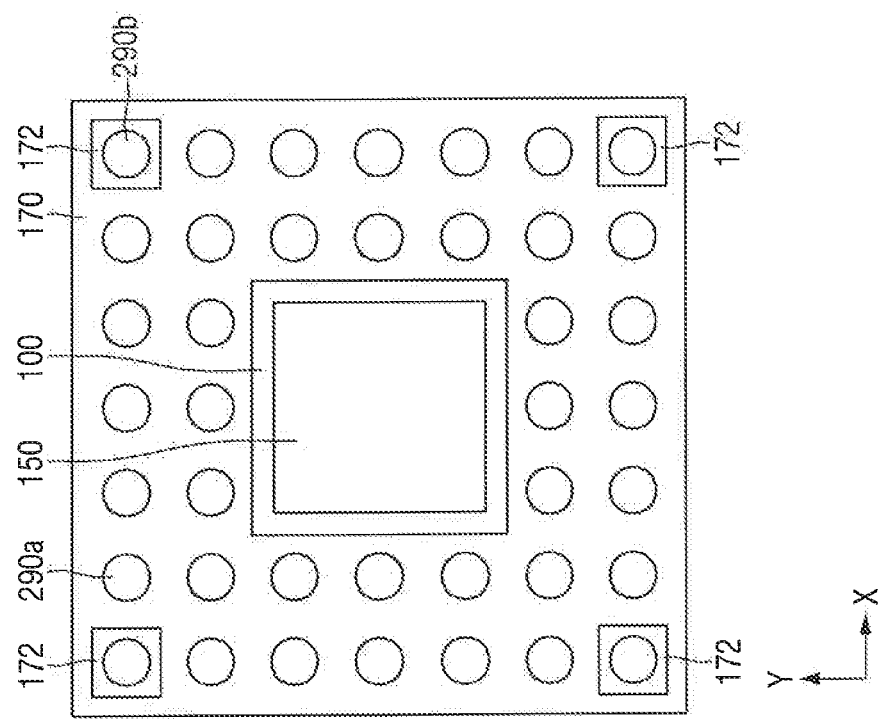
Figure 12:
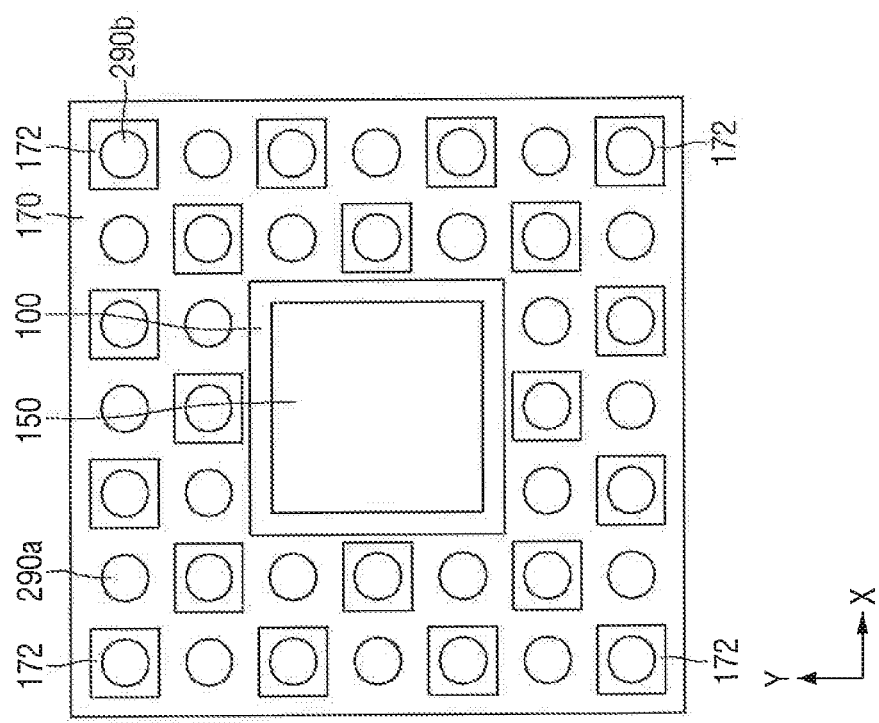

FIGS. 10 to 12 illustrate layout diagrams of a semiconductor package according to an exemplary embodiment of the present inventive concept. For simplicity of description, redundant parts of the description made with reference to FIGS. 1 to 6 will be recapitulated or omitted.

Referring to FIG. 10, the second passivation layers 172 may be disposed on the first substrate 100. For example, the second passivation layers 172 may be disposed at both sides of the top surface of the first substrate 100. For example, the second passivation layer 172 may be disposed at opposing sides of the first substrate 100. Since the second passivation layers 172 are located at both sides of the semiconductor package, in which the warpage occurs, it is possible to decrease the warpage of the semiconductor package, and increase the connection between the interposer 200 and the first substrate 100.

Referring to FIG. 11, the second passivation layers 172 may be disposed on the first substrate 100. For example, the second passivation layers 172 may be disposed on an edge part of the first substrate 100. Since the second passivation layers 172 are located at the edge part of the semiconductor package, in which the warpage occurs, it is possible to decrease the warpage of the semiconductor package, and increase the connection between the interposer 200 and the first substrate 100.

In an exemplary embodiment of the present inventive concept, second passivation layers 172 may be disposed on the corners of the first substrate 100, respectively.

Referring to FIG. 12, the second passivation layers 172 may be disposed on the first substrate 100. For example, the second passivation layers 172 may be disposed on the first substrate 100 in a zigzag shape. As another example, the second passivation layers 172 may have an alternating arrangement. Accordingly, the warpage of the semiconductor package may be reduced, and the connection between the interposer 200 and the first substrate 100 may be increased.

Hereinafter, a semiconductor package according to an exemplary embodiment of the present inventive concept will be described with reference to FIGS. 13 and 14.

Figure 13:
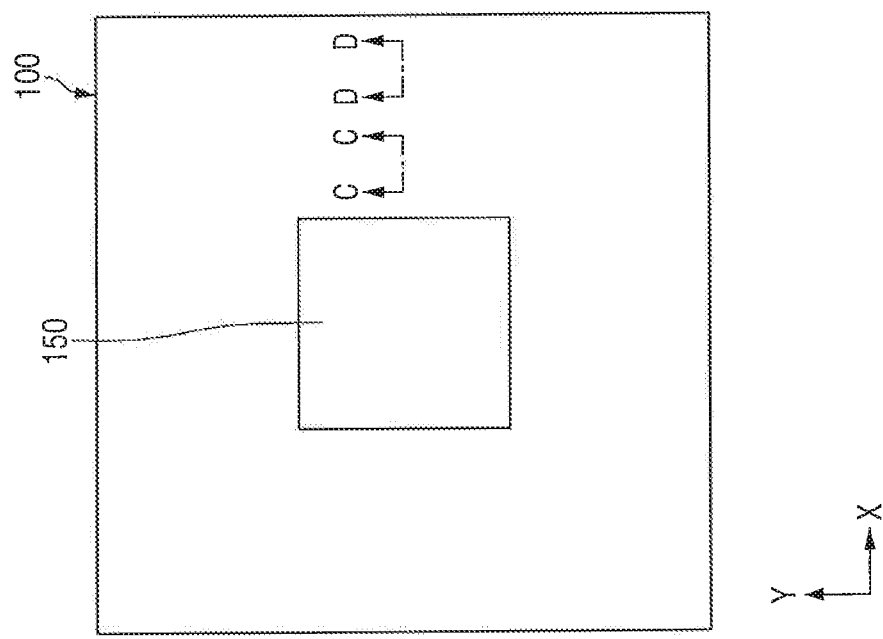
FIG. 13 is a layout diagram of a semiconductor package according to an exemplary embodiment of the present inventive concept.

FIG. 13 is a layout diagram of a semiconductor package according to an exemplary embodiment of the present inventive concept. FIG. 14 is a schematic cross-sectional view taken along lines C-C and D-D of FIG. 13. For simplicity of description, redundant parts of the description made with reference to FIGS. 1 to 9 will be recapitulated or omitted.

Figure 14:
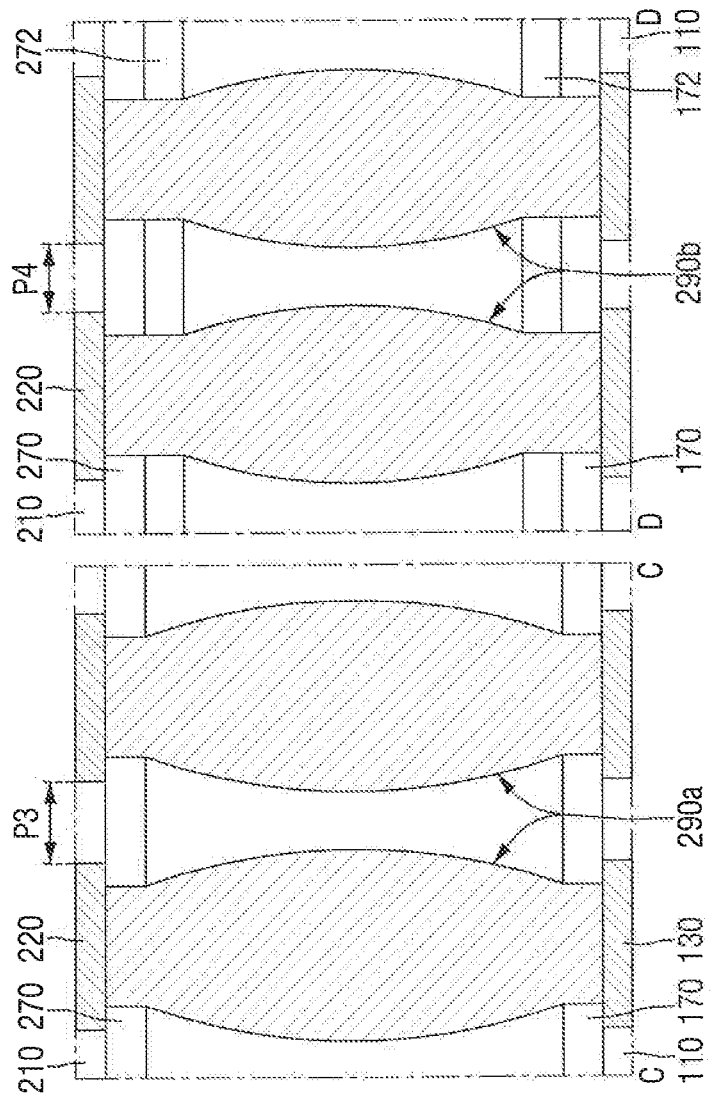
FIG. 14 is a schematic cross-sectional view taken along lines C-C and D-D of FIG. 13.

Referring to FIGS. 13 and 14, the semiconductor package may include a plurality of first connection terminals 290a. For example, the first connection terminals 290a may be interposed between the first substrate 100 and the interposer 200. Here, a distance between the first connection terminals 290a may be a third pitch P3.

In an exemplary embodiment of the present inventive concept, the semiconductor package may include a plurality of second connection terminals 290b. For example, the plurality of second connection terminals 290b may be interposed between the first substrate 100 and the interposer 200. Here, a distance between the second connection terminals 290b may be a fourth pitch P4.

As described with reference to FIG. 9, the thickness of the first connection ball 294a of the first connection terminal 290a may be greater than the thickness of the second connection ball 294b of the second connection terminal 290b. Therefore, the number of second connection terminals 290b may be greater than that of the first connection terminal 290a on the same area. In addition, the fourth pitch P4 may be smaller than the third pitch P3. Consequently, the warpage occurring at the edge part of the semiconductor package can be decreased.

Hereinafter, semiconductor packages according to an exemplary embodiment of the present inventive concept will be described with reference to FIGS. 15A and 15B.

Figure 15A:
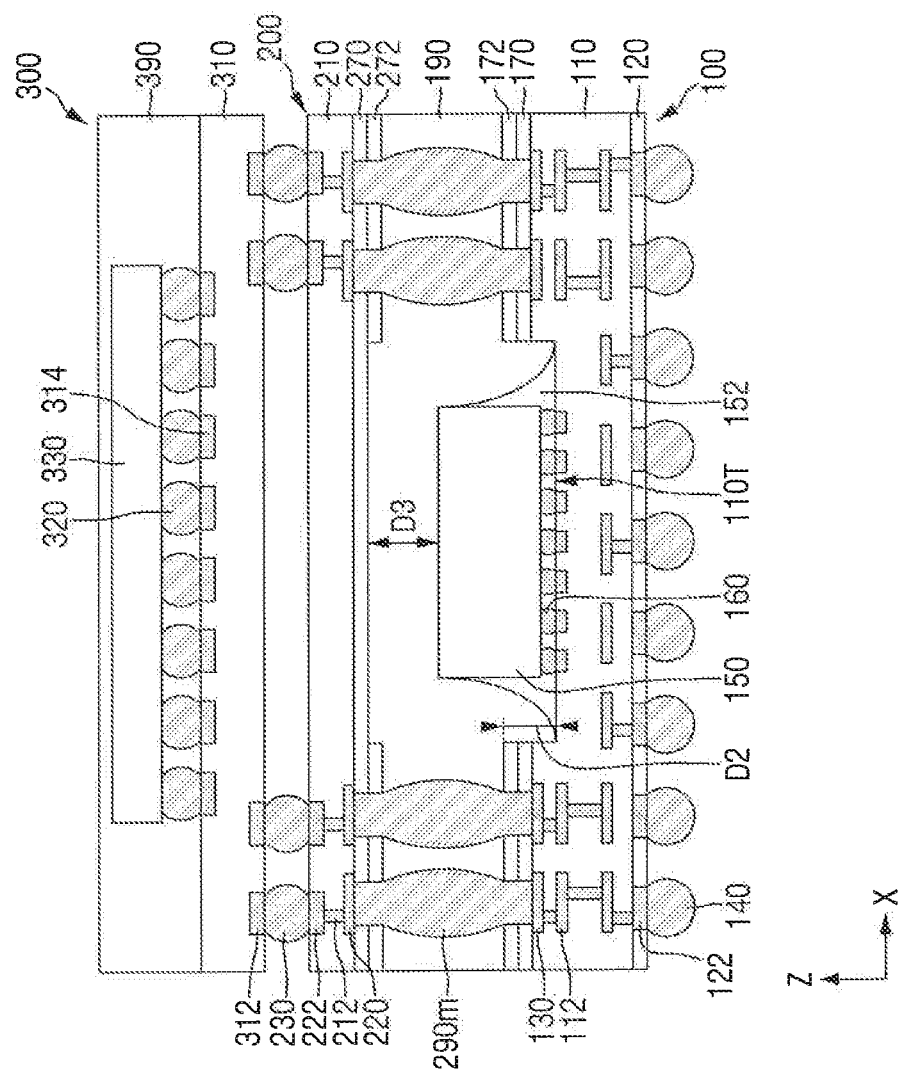
FIGS. 15A and 15B are schematic cross-sectional views of semiconductor packages according to an exemplary embodiment of the present inventive concept.
Figure 15B:
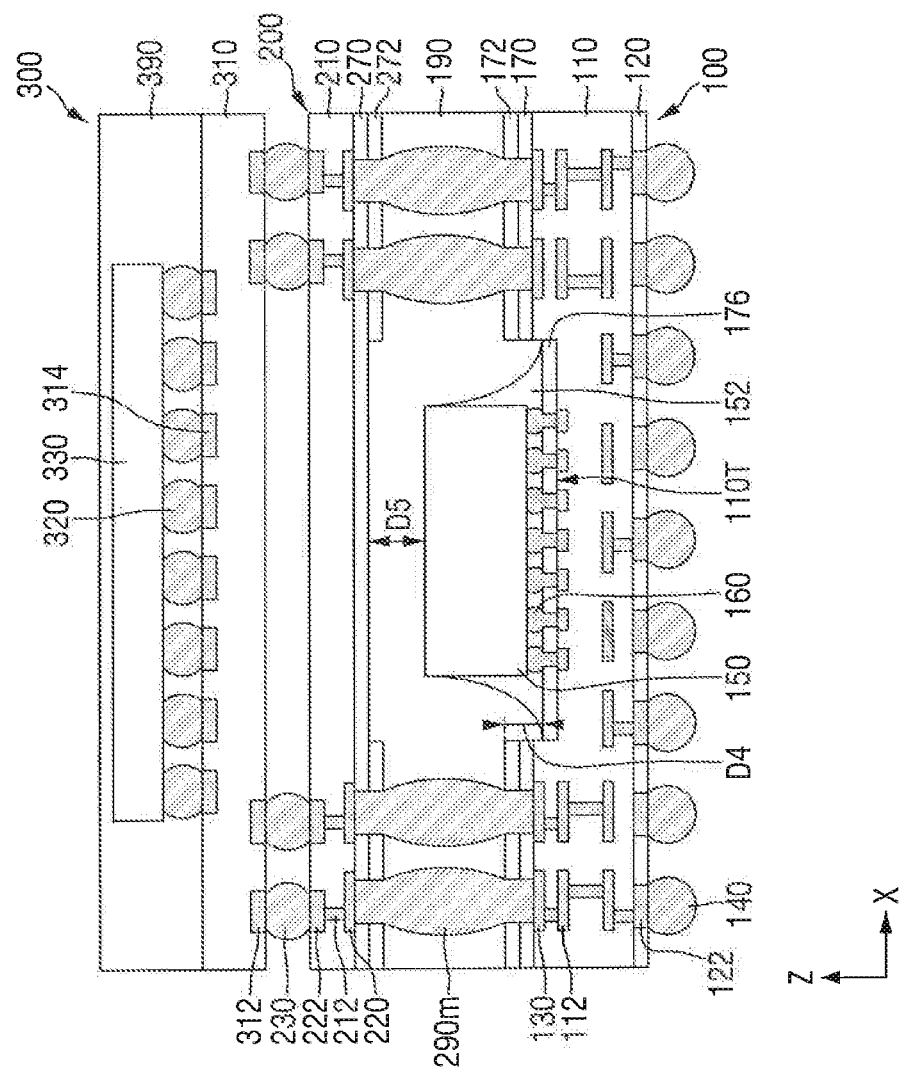

FIGS. 15A and 15B are schematic cross-sectional views of semiconductor packages according to an exemplary embodiment of the present inventive concept. For simplicity of description, redundant parts of the description made with reference to FIGS. 1 to 6 will be recapitulated or omitted.

Referring to FIG. 15A, the first substrate 100 may include a trench 110T. For example, the trench 110T may be formed by depression of the insulating layer 110, the first passivation layer 170, and the second passivation layer 172. The sidewalls of the first and second passivation layers 170 and 172 may be exposed to the trench 110T. The sidewall and top surface of the insulating layer 110 may be exposed to the trench 110T. The depression may be made from the top surface of the second passivation layer 172 by a second distance D2 to form the trench 110T. For example, sidewalls of the first and second passivation layers 170, sidewalls of the insulating layer 110, and an upper surface of the insulating layer 110 may form the trench 110T.

As the first substrate 100 includes the trench 110T, the distance between the top surface of the first semiconductor chip 150 and the interposer 200 may become a third distance D3. In this case, the third distance D3 may be greater than the first distance D1 described with reference to FIG. 2. For example, as the distance between the first semiconductor chip 150 and the interposer 200 increases, a warpage margin of the semiconductor package can be secured. Further, the connection between the interposer 200 and the first substrate 100 of the semiconductor package can be increased.

The underfill 152 may fill the trench 10T. For example, the underfill 152 may be formed in a space provided by the trench 110T. Since the trench 110T serves as a dam, the underfill 152 may not be in contact with elements such as the merged connection terminal 290*m*.

Referring to FIG. 15B, the semiconductor package may include a passivation layer 176. Unlike FIG. 15A, the passivation layer 176 may be formed in the trench 110T. FIG. 15B illustrates that the passivation layer 176 is formed on the bottom of the trench 110T; however, the present inventive concept is not limited thereto. For example, the passivation layer 176 may be formed on the sidewall of the trench 110T, for example, the sidewalls of the first and second passivation layers 170 and 172.

As the first substrate 100 includes the trench 110T, the distance between the top surface of the first semiconductor chip 150 and the interposer 200 may become a fifth distance D5.

A distance between the top surface of the passivation layer 176 and the top surface of the second passivation layer 172 may be a fourth distance D4. The underfill 152 may fill the trench 110T. For example, the underfill 152 may be formed in the space provided by the trench 110T. Since the trench 10T serves as a dam, the underfill 152 may not be in contact with elements such as the merged connection terminal 290*m*.

Hereinafter, a semiconductor package according to an exemplary embodiment of the present inventive concept will be described with reference to FIG. 16.

Figure 16:
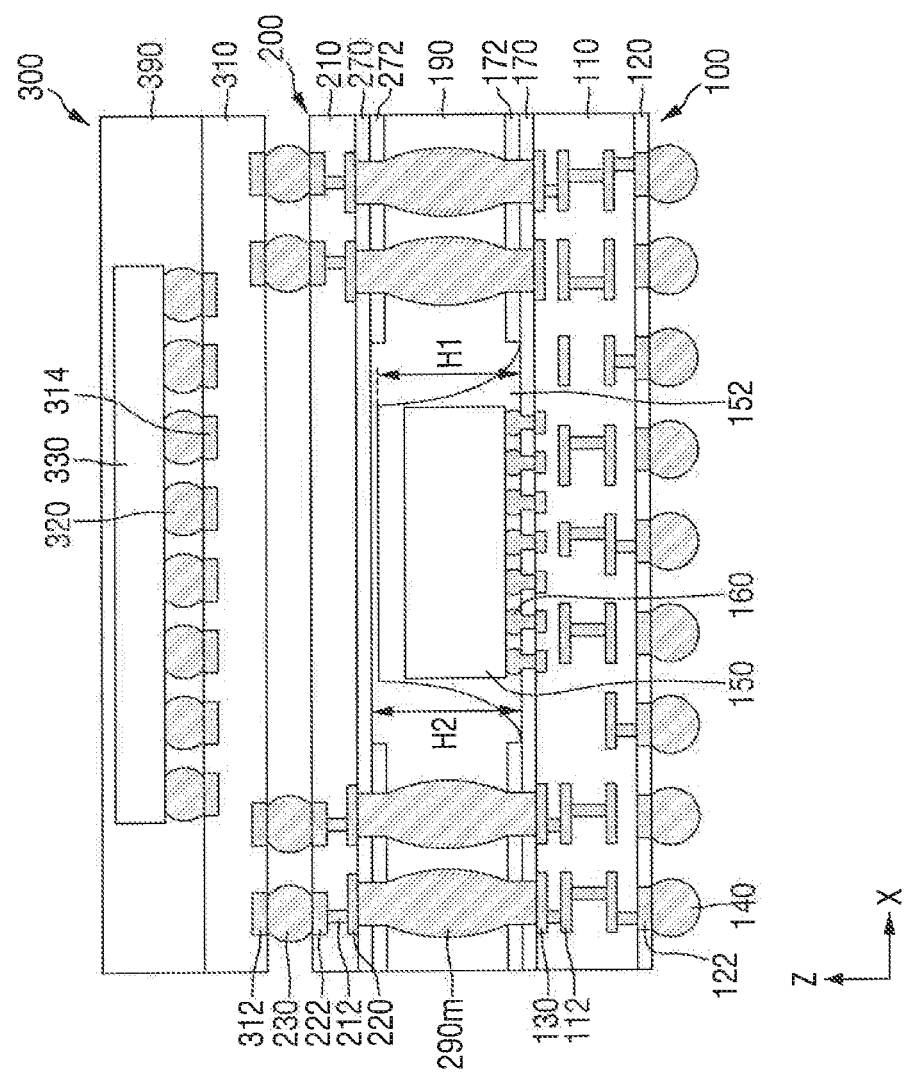
FIG. 16 is a schematic cross-sectional view of a semiconductor package according to an exemplary embodiment of the present inventive concept.

FIG. 16 is a schematic cross-sectional view of a semiconductor package according to an exemplary embodiment of the present inventive concept. For simplicity of description, redundant parts of the description made with reference to FIGS. 1 to 6 will be recapitulated or omitted.

Referring to FIG. 16, the underfill 152 may be formed along the sidewall and the top surface of the first semiconductor chip 150. For example, the underfill 152 may cover the top surface of the first semiconductor chip 150.

As the first semiconductor chip is disposed above the first passivation layer 170 and the merged connection terminal 290*m* is disposed on the second passivation layer 172, the distance between the first semiconductor chip 150 and the interposer 200 may be increased. Accordingly, the underfill 152 may be formed between the top surface of the first semiconductor chip 150 and the bottom surface of the interposer 200.

A distance between the top surface of the first passivation layer 170 and the top surface of the underfill 152 may be a first height H1. A distance between the top surface of the first passivation layer 170 and the bottom surface of the interposer 200 may be a second height H2. In this case, the second height H2 may be greater than the first height H1. Accordingly, the underfill 152 may not be in contact with the interposer 200. For example, a space may be between the underfill 152 and the interposer 200.

Hereinafter, a semiconductor package according to an exemplary embodiment of the present inventive concept will be described with reference to FIG. 17.

Figure 17:
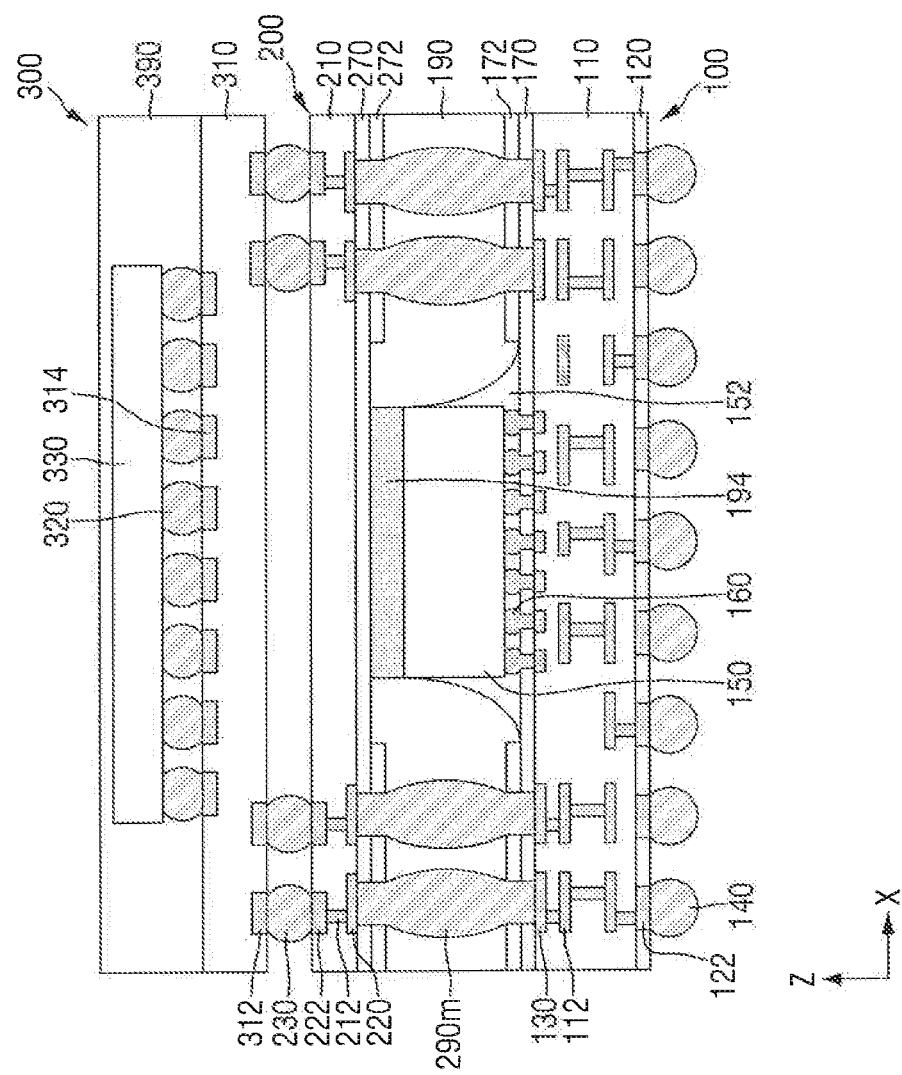
FIG. 17 is a schematic cross-sectional view of a semiconductor package according to an exemplary embodiment of the present inventive concept.

FIG. 17 is a schematic cross-sectional view of a semiconductor package according to an exemplary embodiment of the present inventive concept. For simplicity of description, redundant parts of the description made with reference to FIGS. 1 to 6 will be recapitulated or omitted.

Referring to FIG. 17, the semiconductor package may include a heat transfer portion 194. The heat transfer portion 194 may be a thermal interface material (TIM) layer.

The heat transfer portion 194 may include a material having high thermal conductivity. The heat transfer portion 194 may be, for example, at least one of silver (Ag), aluminum (Al), copper (Cu), platinum (Pt), zinc (Zn), nickel (Ni), and iron (Fe), and an alloy of the metals, but the present inventive concept is not limited thereto. In an exemplary embodiment of the present inventive concept, the heat transfer portion 194 may include copper (Cu).

Since the first semiconductor chip 150 is spaced apart from the interposer 200, the heat transfer portion 194 may be formed between the first semiconductor chip 150 and the interposer 200. For example, the heat transfer portion 194 may fill a space between the first semiconductor chip 150 and the interposer 200. Accordingly, heat generated from the first semiconductor chip 150 may be discharged to the outside via the heat transfer portion 194.

Hereinafter, semiconductor packages according to an exemplary embodiment of the present inventive concept will be described with reference to FIGS. 18 to 19.

Figure 18:
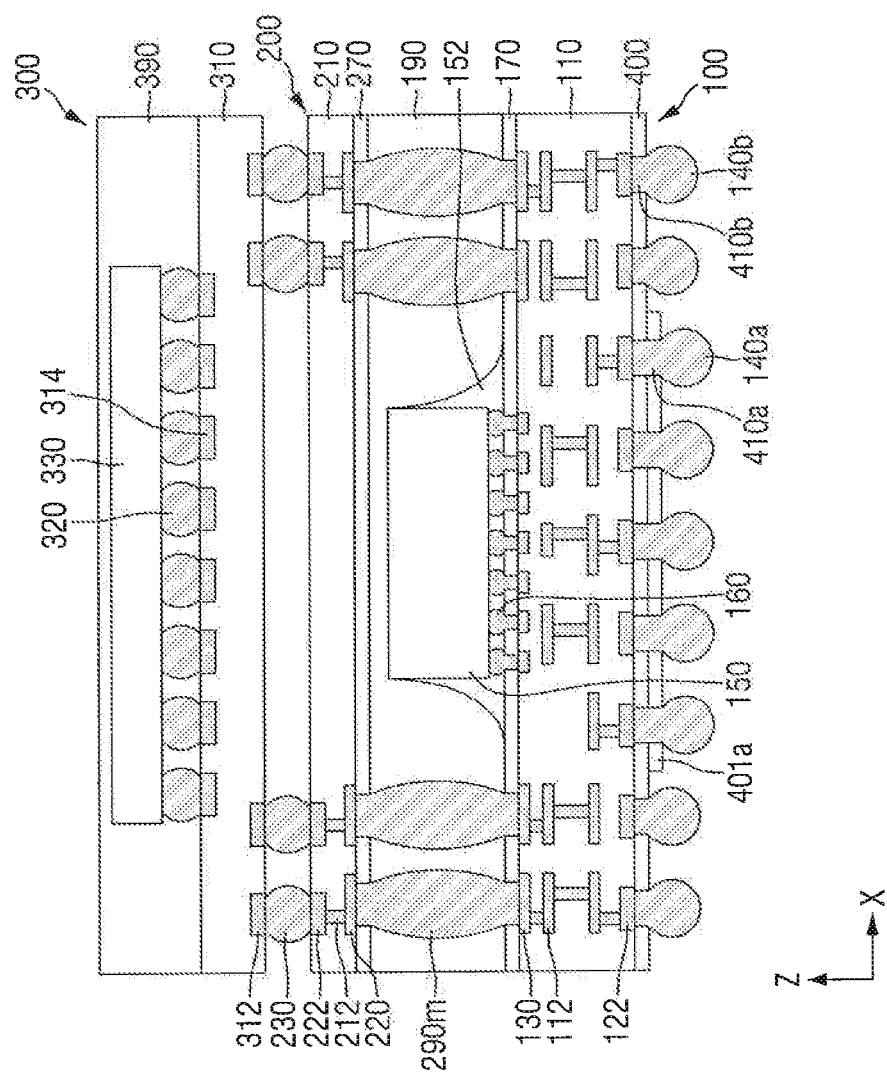
FIG. 18 is a schematic cross-sectional view of a semiconductor package according to an exemplary embodiment of the present inventive concept.

FIG. 18 is a schematic cross-sectional view of a semiconductor package according to an exemplary embodiment of the present inventive concept. FIG. 19 is a schematic cross-sectional view of a semiconductor package according to an exemplary embodiment of the present inventive concept. For simplicity of description, redundant parts of the description made with reference to FIGS. 1 to 6 will be recapitulated or omitted.

Referring to FIG. 18, the semiconductor package according to an exemplary embodiment of the present inventive concept may include passivation layers 400 and 401*a*, connection pillars 410*a* and 410*b*, and connection terminals 140*a* and 140*b*.

In this case, the semiconductor package according to an exemplary embodiment of the present inventive concept may not include the second and fourth passivation layers 172 and 272. However, the present inventive concept is not limited thereto, and the semiconductor package may include the second and fourth passivation layers 172 and 272.

The lower pad 122 may be located in the insulating layer 110. The lower pad 122 may be disposed in the lower part of the insulating layer 110. The bottom surface of the lower pad 122 may be exposed from the bottom surface of the insulating layer 110. For example, the top surface and sidewall of the lower pad 122 may be surrounded by the insulating layer 110. The lower pad 122 may be electrically connected to the conductive pattern 112.

In an exemplary embodiment of the present inventive concept, the passivation layer 400 may be formed under the insulating layer 110. For example, the passivation layer 400 may entirely cover the insulating layer 110. The passivation layer 400 may be formed to partially expose the lower pad 122. For example, the lower pad 122 may be exposed through a hole of the passivation layer 400. For example, the passivation layer 400 may partially cover the lower pad 122.

The passivation layer 401*a* may be formed under the passivation layer 400. For example, the passivation layer 401*a* may partially cover the passivation layer 400. For example, the passivation layer 401*a* may cover the center part of the passivation layer 400. For example, the passivation layer 401*a* may not cover the edge part of the passivation layer 400. The passivation layer 401*a* may be formed to partially expose the lower pad 122. The lower pad 122 may be exposed through a hole of the passivation layer 401a. For example, the passivation layer 401a may partially cover the lower pad 122.

The connection terminal 140a and the connection pillar 410a may be formed on the lower pad 122. The connection pillar 410a may be formed in the holes of the passivation layers 400 and 401a, through which the lower pad 122 is exposed. The connection terminal 140a may be formed on the connection pillar 410a. For example, the connection terminal 140a and the connection pillar 410a may be a single body. Accordingly, the connection pillar 410a and the connection terminal 140a may be electrically connected to the lower pad 122. In this case, the connection pillar 410a and the connection terminal 140a may be connected to the lower pad 122 located at the center part.

The connection terminal 140b and the connection pillar 410b may be formed on the lower pad 122. The connection pillar 410b may be formed in a hole of the passivation layer 400, through which the lower pad 122 is exposed. For example, the connection pillar 410b may not be formed in a hole of the passivation layer 401a. The connection terminal 140b may be formed on the connection pillar 410b. For example, the connection terminal 140b and the connection pillar 410b may be a single body. Accordingly, the connection pillar 410b and the connection terminal 140b may be electrically connected to the lower pad 122. In this case, the connection pillar 410b and the connection terminal 140b may be connected to the lower pad 122 located at the edge part.

The size of the connection terminal 140a may be substantially the same as the size of the connection terminal 140b. Therefore, a height at which the connection terminal 140a is formed may be different from a height at which the connection terminal 140b is formed. This may be due to a step formed by the passivation layer 400 and the passivation layer 401a.

As the passivation layer 401a is partially formed on the passivation layer 400, and the connection terminal 140a, the connection pillar 410a, the connection terminal 140b, and the connection pillar 410b are formed, it is possible to decrease the warpage of the semiconductor package.

Figure 19:
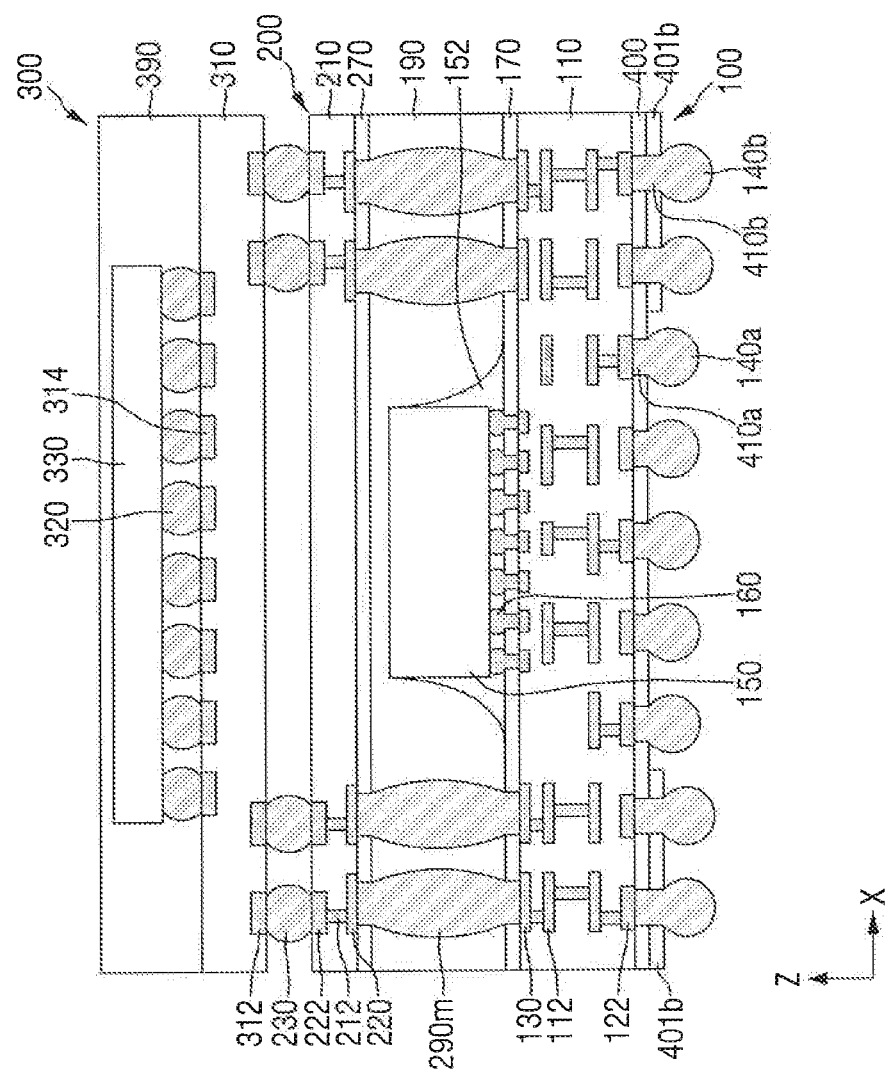
FIG. 19 is a schematic cross-sectional view of a semiconductor package according to an exemplary embodiment of the present inventive concept.

Referring to FIG. 19, the semiconductor package according to an exemplary embodiment of the present inventive concept may include the passivation layer 400, a passivation layer 401b, the connection pillars 410a and 410b, and the connection terminals 140a and 140b.

The passivation layer 401b may be formed on the passivation layer 400. For example, the passivation layer 401b may be formed under the passivation layer 400. For example, the passivation layer 401b may partially cover the passivation layer 400. For example, the passivation layer 401b may cover the edge part of the passivation layer 400. For example, the passivation layer 401b may not cover the center part of the passivation layer 400. The passivation layer 401b may be formed to at least partially expose the lower pad 122. The lower pad 122 may be exposed through a hole of the passivation layer 401b. For example, the passivation layer 401b may partially cover the lower pad 122.

The connection terminal 140a and the connection pillar 410a may be formed on the lower pad 122. The connection pillar 410a may be formed in a hole of the passivation layer 400, through which the lower pad 122 is exposed. The connection terminal 140a may be formed on the connection pillar 410a. Accordingly, the connection pillar 410a and the connection terminal 140a may be electrically connected to the lower pad 122. In this case, the connection pillar 410a and the connection terminal 140a may be connected to the lower pad 122 located at the center part.

The connection terminal 140b and the connection pillar 410b may be formed on the lower pad 122. The connection pillar 410b may be formed in holes of the passivation layers 400 and 401b, through which the lower pad 122 is exposed. The connection terminal 140b may be formed on the connection pillar 410b. Accordingly, the connection pillar 410b and the connection terminal 140b may be electrically connected to the lower pad 122. In this case, the connection pillar 410b and the connection terminal 140b may be connected to the lower pad 122 located at the edge part of the insulating layer 110.

The size of the connection terminal 140a may be substantially the same as the size of the connection terminal 140b. Therefore, the height at which the connection terminal 140a is formed may be different from the height at which the connection terminal 140b is formed. This may be due to a step formed by the passivation layer 400 and the passivation layer 401b stacked on the passivation layer 400.

Since the passivation layer 401b is partially formed on the passivation layer 400, and the connection terminal 140a, the connection pillar 410a, the connection terminal 140b, and the connection pillar 410b are formed, it is possible to decrease the warpage of the semiconductor package.

Hereinafter, semiconductor packages according to an exemplary embodiment of the present inventive concept will be described with reference to FIGS. 20 to 21.

Figure 20:
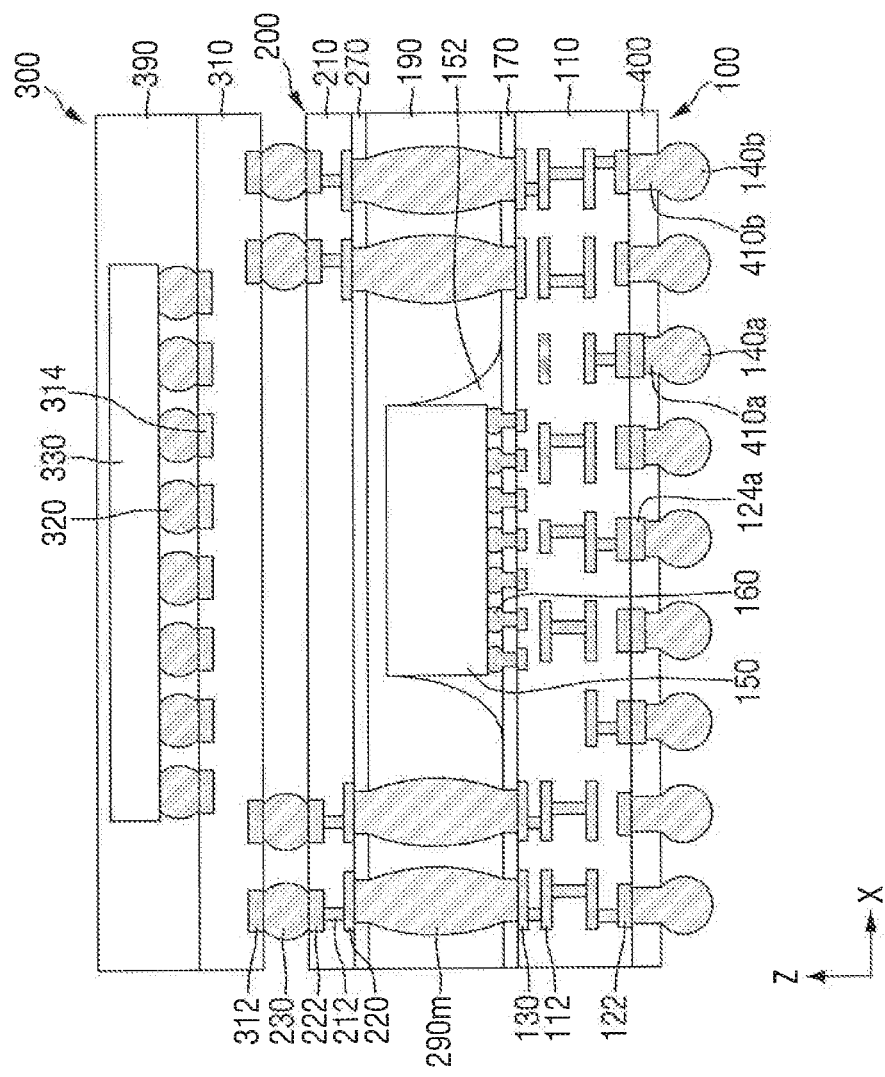
FIG. 20 is a schematic cross-sectional view of a semiconductor package according to an exemplary embodiment of the present inventive concept.

FIG. 20 is a schematic cross-sectional view of a semiconductor package according to an exemplary embodiment of the present inventive concept. FIG. 21 is a schematic cross-sectional view of a semiconductor package according to an exemplary embodiment of the present inventive concept. For simplicity of description, redundant parts of the description made with reference to FIGS. 1 to 6 will be recapitulated or omitted.

Referring to FIG. 20, the semiconductor package according to an exemplary embodiment of the present inventive concept may include the passivation layer 400, the lower pad 122, a lower pad 124a, the connection pillars 410a and 410b, and the connection terminals 140a and 140b.

In this case, the semiconductor package according to an exemplary embodiment of the present inventive concept may not include the second and fourth passivation layers 172 and 272. However, the present inventive concept is not limited thereto, and the semiconductor package may include the second and fourth passivation layers 172 and 272.

The lower pad 122 may be located in the insulating layer 110. For example, the lower pad 122 may be disposed in the lower part of the insulating layer 110. The bottom surface of the lower pad 122 may be exposed from the insulating layer 110. For example, the bottom surface of the lower pad 122 may be exposed from the bottom surface of the insulating layer 110. For example, the top surface and sidewall of the lower pad 122 may be surrounded by the insulating layer 110. The lower pad 122 may be electrically connected to the conductive pattern 112.

In an exemplary embodiment of the present inventive concept, the lower pad 124a may be formed on the bottom surface of the insulating layer 110. The lower pad 124a may be formed on the lower pad 122. For example, the lower pad 124a and the lower pad 122 may be aligned with each other; however, the present inventive concept is not limited thereto. The lower pad 124a may be formed on the lower pad 122 located at the center. For example, the lower pad 124a may correspond to the lower pad 122 located at the center. The lower pad 124a may not be connected to the lower pad 122 located at the edge of the insulating layer 110.

The lower pad 124a may include the same conductive material as the lower pad 122. For example, the lower pad 124a may include copper (Cu) and the like.

The passivation layer 400 may be formed under the insulating layer 110. The passivation layer 400 may entirely cover the insulating layer 110. The passivation layer 400 may be formed to at least partially expose each of the lower pads 122 and 124a. The lower pads 122 and 124a may be exposed through holes of the passivation layer 400. For example, the passivation layer 400 may partially cover each of the lower pads 122 and 124a.

The connection terminal 140a and the connection pillar 410a may be formed on the lower pad 124a. The connection pillar 410a may be formed in the hole of the passivation layer 400, through which the lower pad 124a is exposed. The connection terminal 140a may be formed on the connection pillar 410a. Accordingly, the connection pillar 410a and the connection terminal 140a may be electrically connected to the lower pad 124a. In this case, the connection pillar 410a and the connection terminal 140a may be connected to the lower pad 124a located at the center part of the insulating layer 110.

The connection terminal 140b and the connection pillar 410b may be formed on the lower pad 122. The connection pillar 410b may be formed in the hole of the passivation layer 400, through which the lower pad 122 is exposed. The connection terminal 140b may be formed on the connection pillar 410b. Therefore, the connection pillar 410b and the connection terminal 140b may be electrically connected to the lower pad 122. In this case, the connection pillar 410b and the connection terminal 140b may be connected to the lower pad 122 located at the edge part of the insulating layer 110.

The thickness of the connection pillar 410a may be smaller than the thickness of the connection pillar 410b. This may be due to the lower pad 124a formed at the center part of the insulating layer 110. For example, as the semiconductor package includes the lower pad 124a connected to the lower pad 122, it is possible to decrease the warpage of the semiconductor package.

Figure 21:
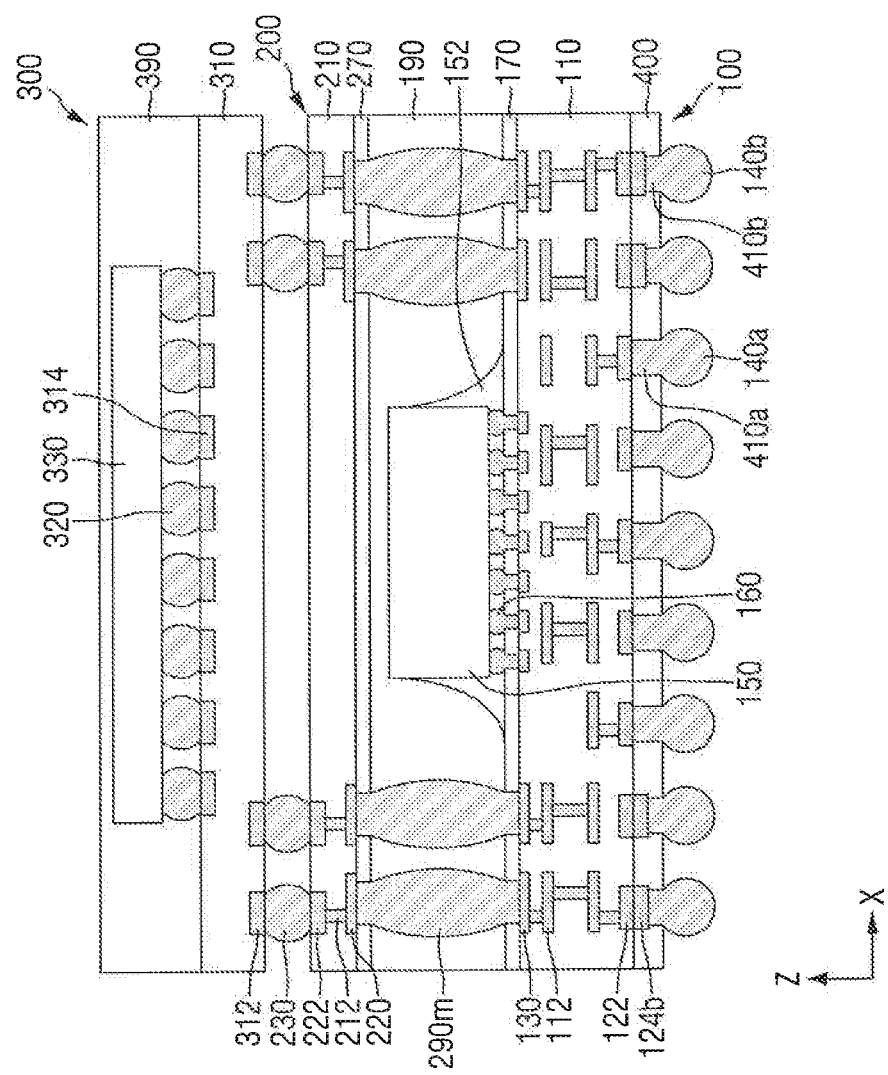
FIG. 21 is a schematic cross-sectional view of a semiconductor package according to an exemplary embodiment of the present inventive concept.

Referring to FIG. 21, the semiconductor package according to an exemplary embodiment of the present inventive concept may include the passivation layer 400, the lower pad 122, a lower pad 124b, the connection pillars 410a and 410b, and the connection terminals 140a and 140b.

In an exemplary embodiment of the present inventive concept, the lower pad 124b may be formed on the bottom surface of the insulating layer 110. The lower pad 124b may be formed on the lower pad 122. The lower pad 124b may be formed on the lower pad 122 located at the edge part of the insulating layer 110. For example, the lower pad 124b may correspond to the lower pad 122 located at the edge part. The lower pad 124b may not be connected to the lower pad 122 located at the center part of the insulating layer 110.

The lower pad 124b may include the same conductive material as the lower pad 122. For example, the lower pad 124b may include copper (Cu) and the like.

The passivation layer 400 may be formed under the insulating layer 110. For example, the passivation layer 400 may entirely cover the insulating layer 110. The passivation layer 400 may be formed to at least partially expose each of the lower pads 122 and 124b. The lower pads 122 and 124b may be exposed through holes of the passivation layer 400. For example, the passivation layer 400 may partially cover each of the lower pads 122 and 124b.

The connection terminal 140b and the connection pillar 410b may be formed on the lower pad 124b. The connection pillar 410b may be formed in the hole of the passivation layer 400, through which the lower pad 124b is exposed. The connection terminal 140b may be formed on the connection pillar 410b. Accordingly, the connection pillar 410b and the connection terminal 140b may be electrically connected to the lower pad 124b. In this case, the connection pillar 410b and the connection terminal 140b may be connected to the lower pad 124b located at the edge part of the insulating layer 110.

The connection terminal 140a and the connection pillar 410a may be formed on the lower pad 122. The connection pillar 410a may be formed in a hole of the passivation layer 400, through which the lower pad 122 is exposed. The connection terminal 140a may be formed on the connection pillar 410a. Accordingly, the connection pillar 410a and the connection terminal 140a may be electrically connected to the lower pad 122. In this case, the connection pillar 410a and the connection terminal 140a may be connected to the lower pad 122 located at the center part of the insulating layer 110.

The thickness of the connection pillar 410b may be smaller than the thickness of the connection pillar 410a. This may be due to the lower pad 124b on the lower pad 122 formed at the center part of the insulating layer 110. For example, as the semiconductor package includes the lower pad 124b connected to the lower pad 122, it is possible to decrease the warpage of the semiconductor package.

While the present inventive concept has been described with reference to exemplary embodiments thereof, it will be understood by those of ordinary skill in the art that various changes in form and details may be made thereto without departing from the spirit and scope of the present inventive concept.

What is claimed is:

1. A semiconductor package comprising:
   a first substrate including a first surface including a first region and a second region at least partially surrounding the first region, wherein the first substrate includes a first insulating layer, a first conductive pattern in the first insulating layer, a first passivation layer disposed in the first region and the second region, and a second passivation layer disposed on the first passivation layer in the second region;
   an interposer overlapping the first substrate and including a second insulating layer and a second conductive pattern in the second insulating layer;
   a first connection terminal disposed on the first passivation layer in the first region; and
   a second connection terminal disposed on the second passivation layer in the second region,
   wherein the first conductive pattern and the second conductive pattern are connected to each other through the first connection terminal and the second connection terminal,
   wherein the first connection terminal and the second connection terminal do not overlap vertically, and
   wherein the first connection terminal and the second connection terminal are disposed at a same vertical level as each other, wherein the first connection terminal contacts the first passivation layer and does not contact the second passivation layer, wherein the second connection terminal contacts the first passivation layer and the second passivation layer.

2. The semiconductor package of claim 1, wherein a thickness of the first connection terminal is greater than a thickness of the second connection terminal.

3. The semiconductor package of claim 1, wherein the first connection terminal includes:
   a first connection pillar penetrating the first passivation layer and electrically connected to the first conductive pattern; and
   a first connection ball on the first connection pillar, wherein the first connection ball is electrically connected to the first connection pillar.

4. The semiconductor package of claim 3, wherein the second connection terminal includes:
   a second connection pillar penetrating the first and second passivation layers and electrically connected to the first conductive pattern; and
   a second connection ball on the second connection pillar, wherein the first connection ball is electrically connected to the second connection pillar.

5. The semiconductor package of claim 4, wherein a thickness of the first connection ball is greater than a thickness of the second connection ball.

6. The semiconductor package of claim 4, wherein a thickness of the first connection pillar is smaller than a thickness of the second connection pillar.

7. The semiconductor package of claim 1, wherein the interposer includes a second surface facing the first surface and including a third region and a fourth region surrounding the third region,
   wherein the interposer includes a third passivation layer disposed in the third region and the fourth region, and a fourth passivation layer disposed on the third passivation layer in the fourth region without being disposed in the third region,
   wherein the first region and the third region overlap each other, and
   wherein the second region and the fourth region overlap each other.

8. The semiconductor package of claim 7, wherein the first connection terminal penetrates the third passivation layer in the third region to be electrically connected to the second conductive pattern, and
   wherein the second connection terminal penetrates the third and fourth passivation layers in the fourth region to be electrically connected to the second conductive pattern.

9. The semiconductor package of claim 1, wherein the second passivation layer is disposed at an edge part of the second region.

10. The semiconductor package of claim 1, wherein the first surface includes a third region surrounded by the first region, and
    wherein the first passivation layer covers the third region, and the second passivation layer does not cover the third region.

11. The semiconductor package of claim 10, further comprising a first semiconductor chip mounted on the third region of the first surface,
    wherein a top surface of the first semiconductor chip is spaced apart from the interposer.

12. The semiconductor package of claim 11, further comprising an underfill material disposed on the first passivation layer in the third region and the top surface and a sidewall of the first semiconductor chip,
    wherein the underfill material is spaced apart from the interposer.

13. A semiconductor package comprising:
    a first substrate including a first surface, a first insulating layer, a first conductive pattern in the first insulating layer, and a first passivation layer disposed on the first surface;
    a first semiconductor chip disposed on the first surface and electrically connected to the first conductive pattern of the first substrate through a first connection terminal in the first passivation layer;
    an interposer overlapping the first surface and including a second surface facing the first surface, wherein the interposer includes a second insulating layer, a second conductive pattern in the second insulating layer, and a second passivation layer disposed on the second surface; and
    a second connection terminal including a first connection pillar penetrating the first passivation layer to be connected to the first conductive pattern, a second connection pillar penetrating the second passivation layer to be connected to the second conductive pattern, and a first connection ball connecting the first connection pillar to the second connection pillar,
    wherein a thickness of the first passivation layer on which the second connection terminal is disposed is greater than a thickness of the first passivation layer on which the first semiconductor chip is disposed,
    wherein the first passivation layer and the second passivation layer are spaced apart and face each other,
    wherein the first passivation layer is disposed under the first connection ball, and the second passivation layer is disposed on the first connection ball, and
    wherein the second passivation layer is a single layer, wherein a thickness of a first portion of the second passivation layer on which the second connection terminal is disposed is greater than a thickness of a second portion of the second passivation layer overlapping the first semiconductor chip.

14. The semiconductor package of claim 13, further comprising:
    a second substrate disposed on a third surface opposite to the second surface of the interposer;
    a second semiconductor chip mounted on the second substrate; and
    a third connection terminal disposed between the interposer and the second semiconductor chip and connecting the interposer to the second semiconductor chip.

15. The semiconductor package of claim 14, wherein the first semiconductor chip includes a logic chip, and
    the second semiconductor chip includes a memory chip.

16. The semiconductor package of claim 13, further comprising a fourth connection terminal spaced apart from the second connection terminal, wherein the fourth connection terminal includes a third connection pillar penetrating the first passivation layer to be connected to the first conductive pattern, a fourth connection pillar penetrating the second passivation layer to be connected to the second conductive pattern, and a second connection ball connecting the third connection pillar to the fourth connection pillar.

17. The semiconductor package of claim 16, wherein a thickness of the first passivation layer on which the fourth connection terminal is disposed is less than a thickness of the first passivation layer on which the second connection terminal is disposed.

18. The semiconductor package of claim 16, wherein a thickness of the first connection ball is less than a thickness of the second connection ball.

19. A semiconductor package comprising:
a first substrate including a first surface, the first substrate including a first insulating layer, a first conductive pattern in the first insulating layer, and a plurality of first passivation layers disposed on the first surface;
a first semiconductor chip mounted on the first surface of the first substrate;
an interposer overlapping the first surface of the first substrate, and spaced apart from the first semiconductor chip, wherein the interposer includes a second surface facing the first surface of the first substrate, a second insulating layer, a second conductive pattern in the second insulating layer, and a plurality of second passivation layers disposed on the second surface;
a first connection terminal disposed between the first passivation layers and the second passivation layers, wherein the first connection terminal penetrates the plurality of first passivation layers and the plurality of second passivation layers to electrically connect the first conductive pattern to the second conductive pattern;
a second substrate disposed on a third surface opposite to the second surface of the interposer;
a second semiconductor chip mounted on the second substrate;
a second connection terminal disposed between the interposer and the second substrate, and electrically connecting the interposer to the second substrate; and
a third connection terminal disposed on the first substrate and contacting only one of the plurality of second passivation layers,
wherein the first semiconductor chip is spaced apart from the plurality of first passivation layers, and
wherein the plurality of first passivation layers and the plurality of second passivation layers are spaced apart and face each other,
wherein a thickness of the plurality of first passivation layers in a first region that the first connection terminal is disposed is greater than a thickness of the plurality of first passivation layers in a second region that first connection terminal is not disposed,
wherein a thickness of the plurality of second passivation layers in the first region is greater than a thickness of the plurality of second passivation layers in the second region.

20. A semiconductor package comprising:
a first substrate including a first surface and a second surface including a first region and a second region different from the first region, wherein the first substrate includes a first insulating layer, a first conductive pattern in the first insulating layer, and a plurality of connection pads connected to the first conductive pattern and disposed on the second surface;
an interposer disposed overlapping the first substrate and including a second insulating layer and a second conductive pattern in the second insulating layer;
a connector disposed on the first surface of the first substrate and directly connecting the first conductive pattern of the first substrate to the second conductive pattern of the interposer;
a first passivation layer disposed on the second surface in the first region and the second region;
a second passivation layer disposed on the first passivation layer in the second region without extending along the first region;
a first connection terminal disposed on the first passivation layer in the first region and connected to a first connection pad of the plurality of connection pads, wherein the first connection terminal contacts the first passivation layer and does not contact the second passivation layer; and
a second connection terminal disposed on the second passivation layer in the second region and connected to a second connection pad of the plurality of connection pads, wherein the second connection terminal contacts the first passivation layer and the second passivation layer,
wherein the first and second passivation layers are disposed on a lower surface of the first insulating layer, and
wherein the first connection terminal and the second connection terminal do not overlap vertically.

* * * * *